(12) United States Patent
George et al.

(10) Patent No.: US 10,319,615 B2
(45) Date of Patent: *Jun. 11, 2019

(54) SEMICONDUCTOR BONDING APPARATUS AND RELATED TECHNIQUES

(71) Applicant: SUSS MicroTec Lithography GmbH, Garching (DE)

(72) Inventors: Gregory George, Colchester, VT (US); Hale Johnson, Jericho, VT (US)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/843,628

(22) Filed: Dec. 15, 2017

(65) Prior Publication Data

US 2018/0108547 A1  Apr. 19, 2018

Related U.S. Application Data

(63) Continuation of application No. 15/440,211, filed on Feb. 23, 2017, now Pat. No. 9,875,917.

(Continued)

(51) Int. Cl.
*B32B 37/00* (2006.01)
*H01L 21/67* (2006.01)
(Continued)

(52) U.S. Cl.
CPC ........ *H01L 21/67092* (2013.01); *H01L 24/75* (2013.01); *B65G 47/91* (2013.01);
(Continued)

(58) Field of Classification Search
CPC ... H01L 21/67092; H01L 24/75; H01L 21/30; H01L 21/4763; H01L 21/683; B65G 47/91
(Continued)

(56) References Cited

U.S. PATENT DOCUMENTS 5,273,553 A   12/1993   Hoshi et al.
6,178,361 B1   1/2001   George et al.
(Continued)

FOREIGN PATENT DOCUMENTS

JP   2003249425 A   9/2003
JP   2014116540 A   6/2014

*Primary Examiner* — James D Sells
(74) *Attorney, Agent, or Firm* — Hayes Soloway PC

(57) ABSTRACT

A semiconductor structure bonding apparatus is disclosed. The apparatus may include a leveling adjustment system configured to provide leveling adjustment of upper and lower block assemblies of the apparatus. In some cases, the leveling adjustment system may include a plurality of threaded posts, differentially threaded adjustment collars, and leveling sleeves. In some instances, the leveling adjustment system further may include a plurality of preload springs configured to provide a given preload capacity and range of adjustment. In some instances, the leveling adjustment system further may include a load cell through which one of the threaded posts may be inserted. In some embodiments, the upper block assembly further may include a reaction plate configured to reduce deformation of the upper block assembly. In some embodiments, the upper block assembly further may include a thermal isolation plate configured to provide compliance deflection and being of monolithic or polylithic construction, as desired.

20 Claims, 27 Drawing Sheets

Related U.S. Application Data

(60) Provisional application No. 62/299,349, filed on Feb. 24, 2016.

(51) Int. Cl.
  *H01L 23/00* (2006.01)
  *B65G 47/91* (2006.01)
  *H01L 21/30* (2006.01)
  *H01L 21/4763* (2006.01)
  *H01L 21/683* (2006.01)

(52) U.S. Cl.
  CPC .......... *H01L 21/30* (2013.01); *H01L 21/4763* (2013.01); *H01L 21/683* (2013.01); *H01L 2224/7531* (2013.01); *H01L 2224/7555* (2013.01); *Y10T 156/10* (2015.01); *Y10T 156/1092* (2015.01); *Y10T 156/1744* (2015.01)

(58) Field of Classification Search
  USPC ....................................................... 156/580
  See application file for complete search history.

(56) References Cited

U.S. PATENT DOCUMENTS

| | | |
|---|---|---|
| 7,064,055 B2 | 6/2006 | Reif et al. |
| 7,118,446 B2 | 10/2006 | Walsh et al. |
| 7,168,607 B2 | 1/2007 | Ehrke et al. |
| 7,645,681 B2 | 1/2010 | Okada |
| 7,948,034 B2 | 5/2011 | George et al. |
| 8,551,291 B2 | 10/2013 | George |
| 8,915,771 B2 | 12/2014 | Vogtmann |
| 9,875,917 B2 * | 1/2018 | George ............... H01L 24/75 |
| 2002/0062787 A1 | 5/2002 | Hashizume et al. |
| 2005/0074927 A1 | 4/2005 | Hsieh et al. |
| 2010/0263794 A1 | 10/2010 | George et al. |
| 2013/0130593 A1 | 5/2013 | Kalenian et al. |
| 2014/0134927 A1 | 5/2014 | Walsh et al. |
| 2014/0318683 A1 | 10/2014 | Johnson et al. |
| 2014/0319786 A1 | 10/2014 | Johnson et al. |
| 2015/0206783 A1 | 7/2015 | Johnson et al. |

* cited by examiner

SEMICONDUCTOR BONDING APPARATUS AND RELATED TECHNIQUES

CROSS-REFERENCE TO RELATED APPLICATIONS

This patent application is a continuation of U.S. patent application Ser. No. 15/440,211, titled "Semiconductor Bonding Apparatus and Related Techniques," filed on Feb. 23, 2017, which claims the benefit of U.S. Provisional Patent Application No. 62/299,349, titled "Simplified Apparatus and Method for Semiconductor Bonding," filed on Feb. 24, 2016, and is related to U.S. Non-Provisional patent application Ser. No. 11/766,531, titled "Apparatus and Method for Semiconductor Bonding," filed on Jun. 21, 2007, now issued as U.S. Pat. No. 7,948,034, dated May 24, 2011. Each of these patent applications and patents is herein incorporated by reference in its entirety.

FIELD OF THE DISCLOSURE

The present disclosure relates to an apparatus and a method for semiconductor bonding and more particularly to a simplified high-force semiconductor bonding apparatus and method.

BACKGROUND

This disclosure relates to improvements to methods and apparatus described in commonly-owned U.S. Pat. No. 7,948,034, the contents of which are incorporated herein by reference as if fully set forth herein.

Consumers desire ever cheaper electrical and electronic devices. A major part of the cost in producing consumer electrical and electronic devices is the cost of the semiconductor devices that provide the very features that make the electronic devices so desired by consumers. Manufacturers of the semiconductor devices thus continue to seek ways to lessen manufacturing costs of the semiconductors. A significant factor in the determination of unit cost for semiconductor devices is defects that may present themselves in a given production lot. As may be realized, loss of semiconductor devices through defects presents a fiscal loss to manufacturers that may generally be accommodated by increasing unit price. An area where defects may be introduced in fabrication of semiconductor devices is in the wafer of substrate bonding. Wafer bonding involves applying heat, force, and sometimes voltage to an aligned stack of two or more wafers in a controlled atmosphere. The goal of any wafer bonding is to produce high integrity bonds, uniformly across the entire wafer area without negatively influencing the wafer to wafer alignment. Improved bonding integrity has been achieved by generating higher interfacial pressures. For improved bonding results, the interfacial pressure can be quite high, and hence it is desired that substantial force be applied to the wafers to be bonded. For example, 100 kN on a 200-mm diameter wafer or 225 kN on a 300-mm diameter wafer. However, although enabling the bond, the high forces also cause flex and distortion of conventional bonding tools that apply the forces, resulting in poor interfacial pressure uniformity, bond quality variability, wafer shift, and post-bond bowing, and defeating the improvements sought by using high bonding forces. In conventional systems, the pressure non-uniformity approaches 50% across the bond interface.

Accordingly, it would be desirable to provide a bonding apparatus that could apply uniform pressure across the entire bond interface. It would also be desirable to have a simplified, less expensive apparatus than has been available to date, and such apparatus that is easier to set up and use than prior solutions.

SUMMARY

The subject matter of this application may involve, in some cases, interrelated products, alternative solutions to a particular problem, and/or a plurality of different uses of a single system or article.

One example embodiment provides a semiconductor structure bonding apparatus. The semiconductor structure bonding apparatus includes a lower block assembly including a first surface configured to receive at least one semiconductor wafer thereon. The semiconductor structure bonding apparatus also includes an upper block assembly. The upper block assembly includes a chuck configured to provide a second surface configured to be brought into contact with the first surface in application of bonding pressure to the at least one semiconductor wafer. The upper block assembly also includes a reaction plate disposed over the chuck and configured to reduce deformation of the upper block assembly. The reaction plate includes: a monolithic plate member; and a plurality of concentric grooves defined in the monolithic plate member and configured to receive a corresponding plurality of seals. The semiconductor structure bonding apparatus also includes a plurality of ports configured to deliver pressurized gas to a plurality of regions of the reaction plate.

In some cases, the plurality of concentric grooves of the reaction plate includes: a first groove; and a second groove concentrically exterior to the first groove. Furthermore, the plurality of ports is configured to deliver pressurized gas to the plurality of regions of the reaction plate such that in bonding 4-inch diameter semiconductor wafers, pressurized gas is applied to a first region defined between the first groove and the second groove. In some such instances: the plurality of concentric grooves of the reaction plate further includes a third groove concentrically exterior to the second groove; and the plurality of ports is further configured to deliver pressurized gas to the plurality of regions of the reaction plate such that in bonding 6-inch diameter semiconductor wafers, pressurized gas is applied to the first region and a second region defined between the second groove and the third groove. In some such instances: the plurality of concentric grooves of the reaction plate further includes a fourth groove concentrically exterior to the third groove; and the plurality of ports is further configured to deliver pressurized gas to the plurality of regions of the reaction plate such that in bonding 8-inch diameter semiconductor wafers, pressurized gas is applied to the first region, the second region, and a third region defined between the third groove and the fourth groove.

In some cases, the reaction plate has defined therein a cutaway portion configured to allow flexure of the reaction plate thereat. In some such instances, at least one of the plurality of seals is concentrically exterior to the cutaway portion.

In some cases, the upper block assembly further includes a thermal isolation plate disposed between the reaction plate and the chuck. In some such instances, the thermal isolation plate includes a plurality of wedge-shaped pieces that are physically separate from one another and configured to move with respect to one another. In some such instances, the plurality of wedge-shaped pieces is configured to be arranged in a circular manner with vertices pointing towards a common center. In some other such instances, at least one of the wedge-shaped pieces includes a plurality of raised projections extending from a surface thereof, the raised projections spaced apart from one another around the surface. In some still other such instances, at least one of the wedge-shaped pieces constitutes a monolithic element. In some still other such instances, at least one of the wedge-shaped pieces constitutes a polylithic element including: a lower plate portion; and an upper plate portion configured to be disposed over and operatively coupled with the lower plate portion such that vacuum can be maintained in a void defined between the lower plate portion and the upper plate portion. In some such cases, the lower plate portion includes a plurality of raised projections disposed on an interior surface thereof and extending toward the upper plate portion within the void defined between the lower plate portion and the upper plate portion, the raised projections spaced apart from one another around the interior surface of the lower plate portion. In some cases, the thermal isolation plate includes: a lower plate portion; and an upper plate portion configured to be disposed over and operatively coupled with the lower plate portion such that vacuum can be maintained in a void defined between the lower plate portion and the upper plate portion. In some such instances, the lower plate portion includes a plurality of raised projections disposed on an interior surface thereof and extending toward the upper plate portion within the void defined between the lower plate portion and the upper plate portion, the raised projections spaced apart from one another around the interior surface of the lower plate portion. In some other such instances, at least one of the lower plate portion and the upper plate portion constitutes a monolithic element. In some cases, the thermal isolation plate is configured to provide compliance deflection of about 50 μm or less.

In some cases, at least one of the plurality of concentric grooves is configured to receive at least one of the corresponding plurality of seals having a 3-mm diameter. In some cases, the plurality of concentric grooves is configured to receive the corresponding plurality of seals such that sealing is maintained at pressures up to about 37 bar. In some cases, the semiconductor structure bonding apparatus further includes a water-cooled flange disposed between the chuck and the reaction plate.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

BRIEF DESCRIPTION OF THE DRAWINGS

Referring to the figures, wherein like numerals represent like parts throughout the several views.

Figure 1:
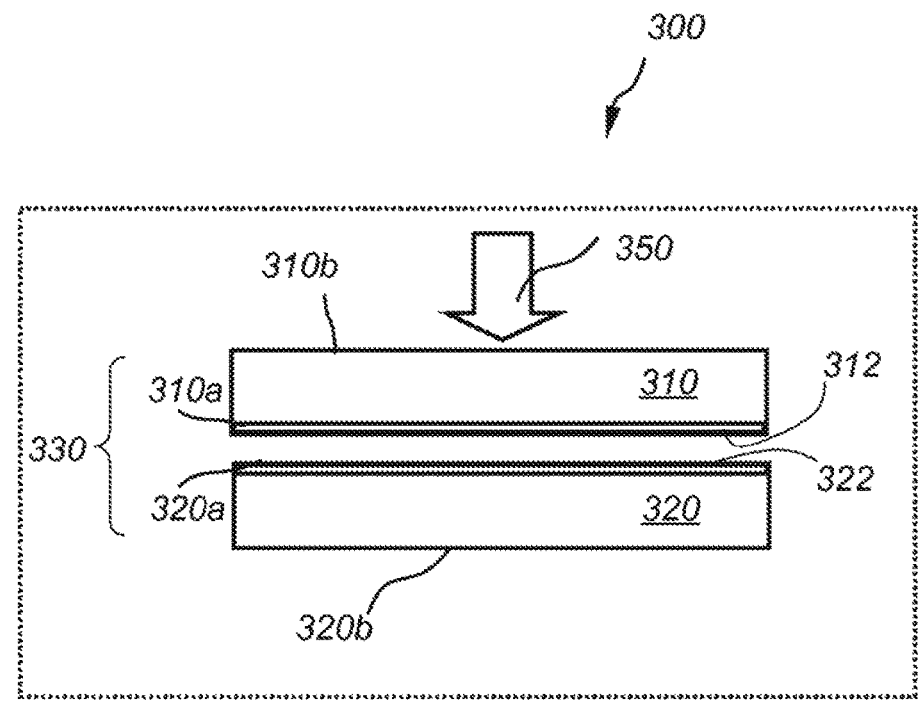
FIG. 1 is a schematic diagram of a prior art wafer bonding system.

These and other features of the present embodiments will be understood better by reading the following detailed description, taken together with the figures herein described. In the drawings, each identical or nearly identical component that is Illustrated in various figures may be represented by a like numeral. For purposes of clarity, not every component may be labeled in every drawing. Furthermore, as will be appreciated in light of this disclosure, the accompanying drawings are not intended to be drawn to scale or to limit the described embodiments to the specific configurations shown.

DETAILED DESCRIPTION

Figure 2A:
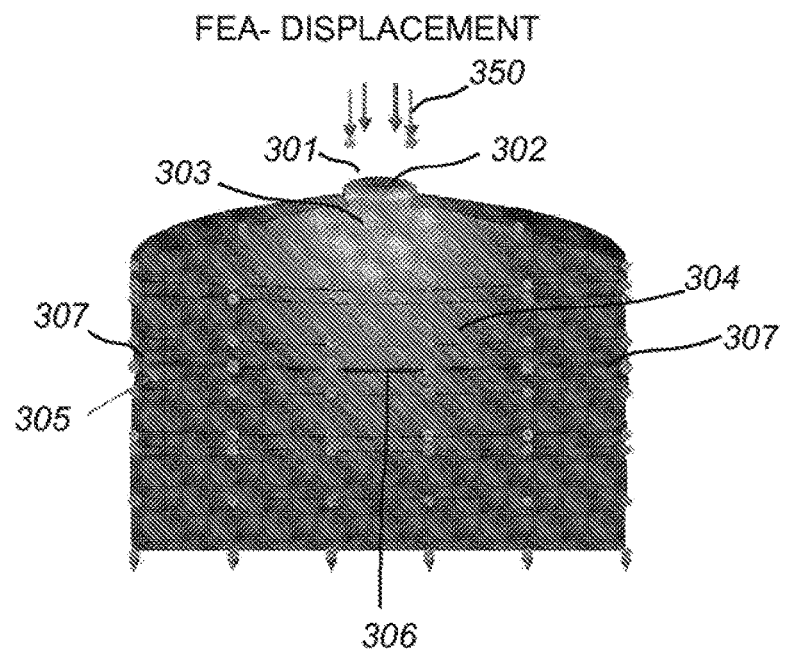
FIG. 2A is a finite element analysis result displaying the displacement along the bond interface for the prior art wafer bonding system of FIG. 1.
Figure 2B:
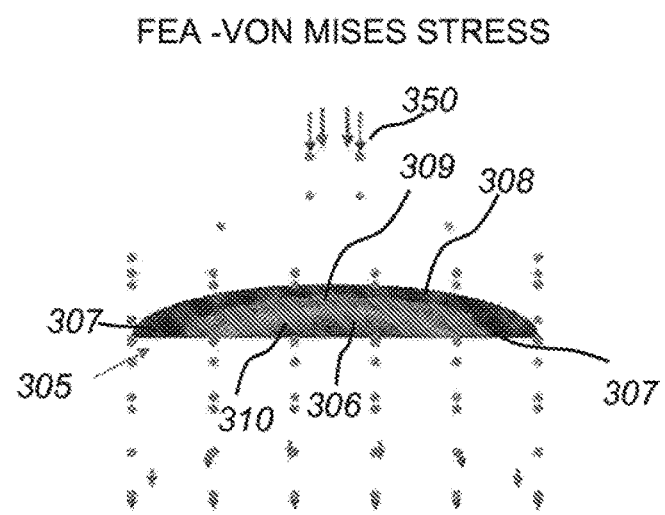
FIG. 2B is a finite element analysis result displaying the Von Mises stress along the bond interface for the prior art wafer bonding system of FIG. 1.

Referring to FIG. 1, in a prior art wafer bonding system 300, a first wafer 310 having a bond layer 312 on a first surface 310a is brought into contact with a second wafer 320 having a bond layer 322 on a first surface 320a, so that the two bond layers 312 and 322 are opposite to each other. The wafer bonding process involves compressing the two wafers together by applying a force 350 on a second surface 310b of the first wafer 310. Force 350 is usually applied to the center of the wafer stack 302 with a piston-type mechanism, as shown in FIG. 1. In other embodiments, force 350 may be applied in the periphery of the wafer stack 302 or a second force may be applied simultaneously with the force 350 on the second surface 320b of the second wafer 320. Finite element analysis (FEA) of the displacement along the bond interface 305 is shown in FIG. 2A. We observe the formation of a "hot pressure spot" directly underneath the central area 301 where the force 350 is applied. A first spherical area 302 directly underneath the central area 301 has a displacement of the order of 30μ. Directly under area 302 is another spherical area 303 where the displacement is of the order of 2-3μ and directly under area 303 is area 304 where the displacement is in the range of 1 μm. The spherical front of the "hot pressure spot" propagates down to the bond interface 305 and causes the central region 306 to be more bowed than the edge regions 307. As we mentioned above, the pressure non-uniformity across the bond interface can reach up to 50%. The Von Mises stresses of the FEA are shown in FIG. 2B. We observe again a spherical stress front propagating down to the bond interface 305, where it causes stress variations between the central 306 and periphery regions 307. Areas 308, 309, and 311 have stresses of the order of 100 Factor of Safety (FOS), 50 FOS, and 10 FOS, respectively.

Figure 3:
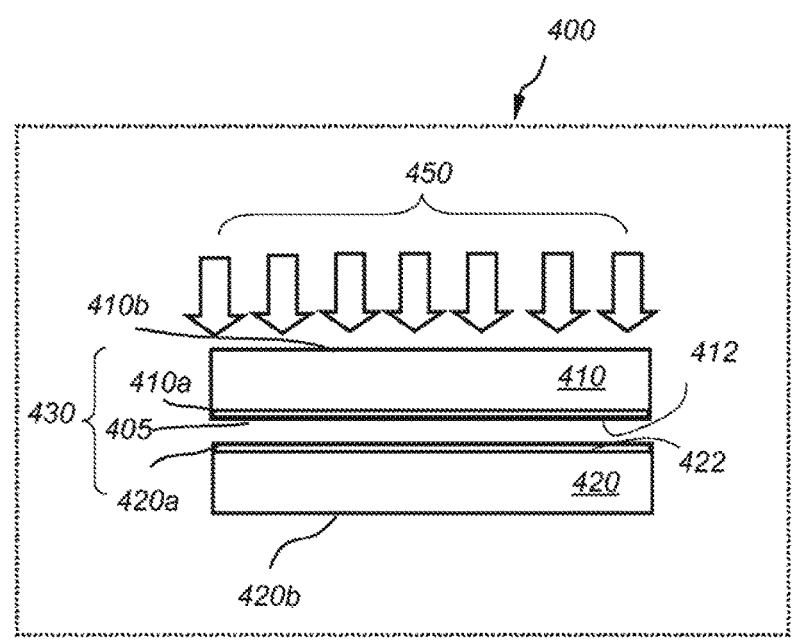
FIG. 3 is a schematic diagram of a wafer bonding system.
Figure 4A:
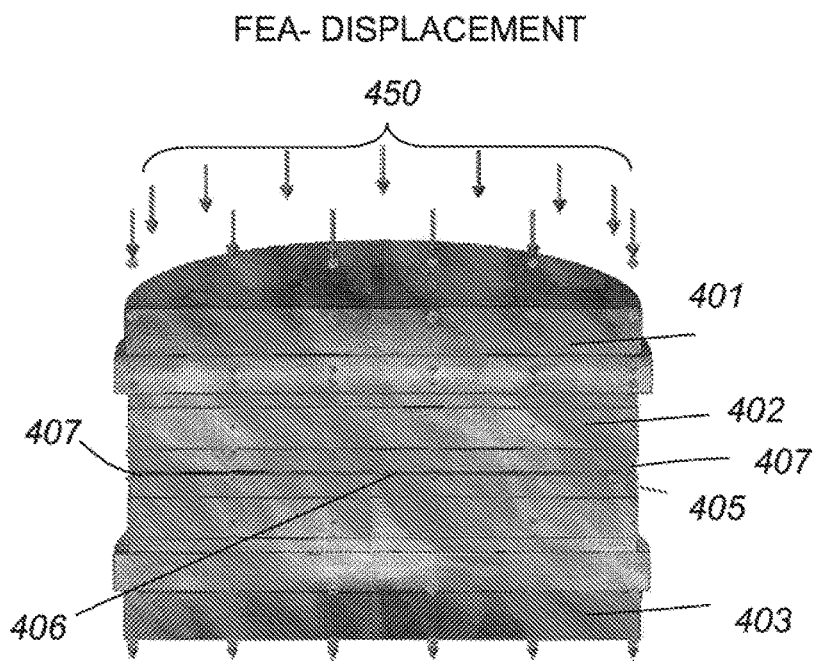
FIG. 4A is a finite element analysis result displaying the displacement along the bond interface for the wafer bonding system of FIG. 3.
Figure 4B:
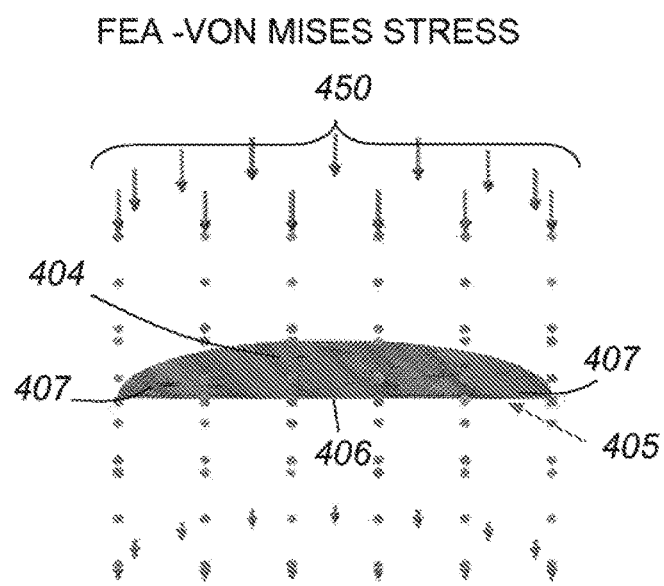
FIG. 4B is a finite element analysis result displaying the Von Mises stress along the bond interface for the wafer bonding system of FIG. 3.
Figure 5:
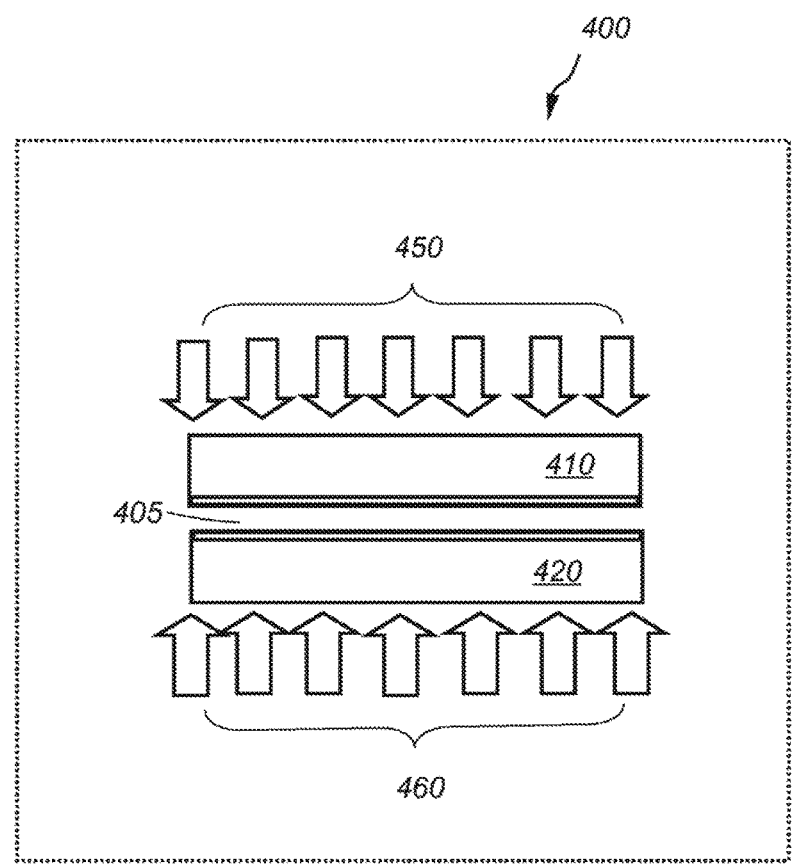
FIG. 5 is a schematic diagram of another embodiment of a wafer bonding system.
Figure 6:
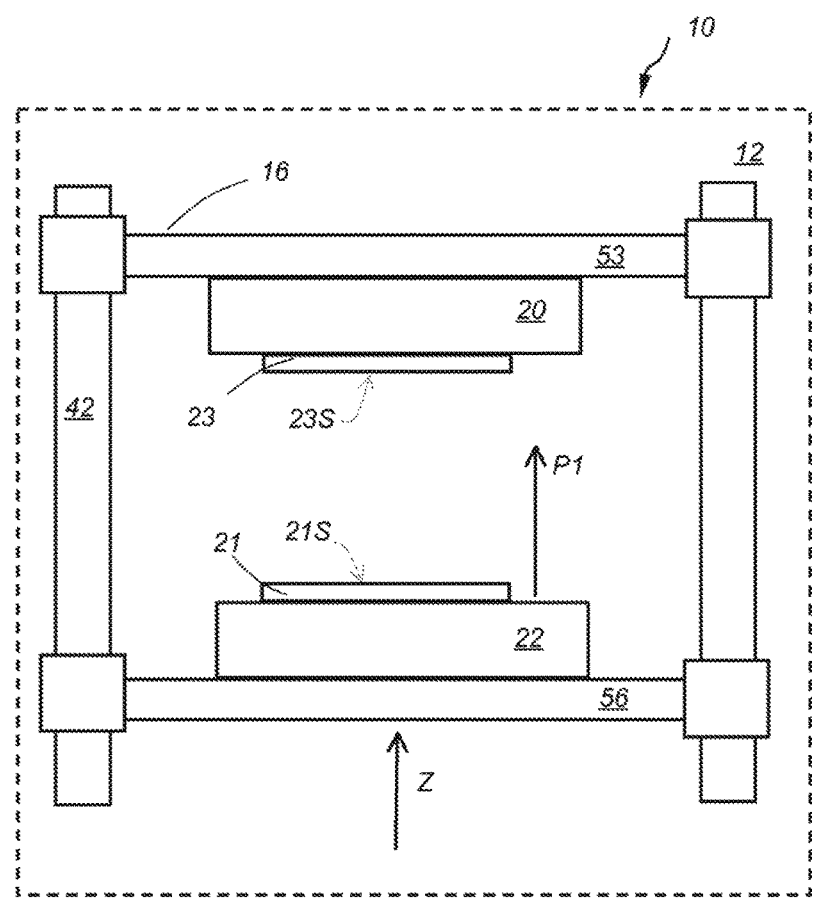
FIG. 6 is a schematic cross-sectional diagram of a wafer bonding apparatus.

Referring to FIG. 3, in a wafer bonding system 400, a first wafer 410 having a first surface 410a is brought into contact with a second wafer 420 having a first surface 420a, so that the two surfaces 410a, 420a are opposite to each other. The wafer bonding process involves compressing the two wafers together by applying a "force column" 450 on a second surface 410b of the first wafer 410. Force column 450 includes a plurality of forces arranged in a column having a base dimensioned to cover the entire second surface 410b of the first semiconductor wafer 410 and is configured to apply a uniform pressure to the entire second surface 410b of the first wafer 410 and to transfer a uniform pressure to the bond interface 405 of the wafer stack 302. In other embodiments, a second force column 460 may be applied simultaneously with force column 450 on the second surface 420b of the second wafer 420, as shown in FIG. 5. In one example, force column 450 is a pressurized gas column and applies forces of the order of 100 kN on a 200-mm wafer, which generates a pressure of approximately 32,000 mbar. Finite element analysis of the displacement and of the Von Mises stresses along the bond interface 405 are shown in FIG. 4A and FIG. 4B, respectively. We observe layers 401, 402, and 403 with uniform displacement and a uniform stress region 404 with no variations between the central 406 and periphery regions 407 of the bond interface 405. In some embodiments, surfaces 410a, 420a have bond layers 412, 422, respectively, configured to promote a specific type of bonding between the two wafer surfaces 410a, 420a. Bond layers 412, 422 may be grid structures, metal, glass, semiconductor structures, insulators, integrated devices, adhesives, or any other bond-promoting material or structure. The system is designed to perform any desirable substrate bond process including anodic, eutectic, adhesive, fusion, glass fit, and thermocompression bond processes for wafer-to-wafer bonding. Accordingly, the system has suitable controls for controlling the bonding operation parameters, including substrate temperature, bond pressure, and chamber atmosphere, among others. In other embodiments, system 400 is used to bond any type of semiconductor structures or materials including flat-panel structures, integrated circuit devices, 3D integration of microelectronics, and packaging of Micro-Electro-Mechanical-Systems (MEMS), among others.

Figure 18:
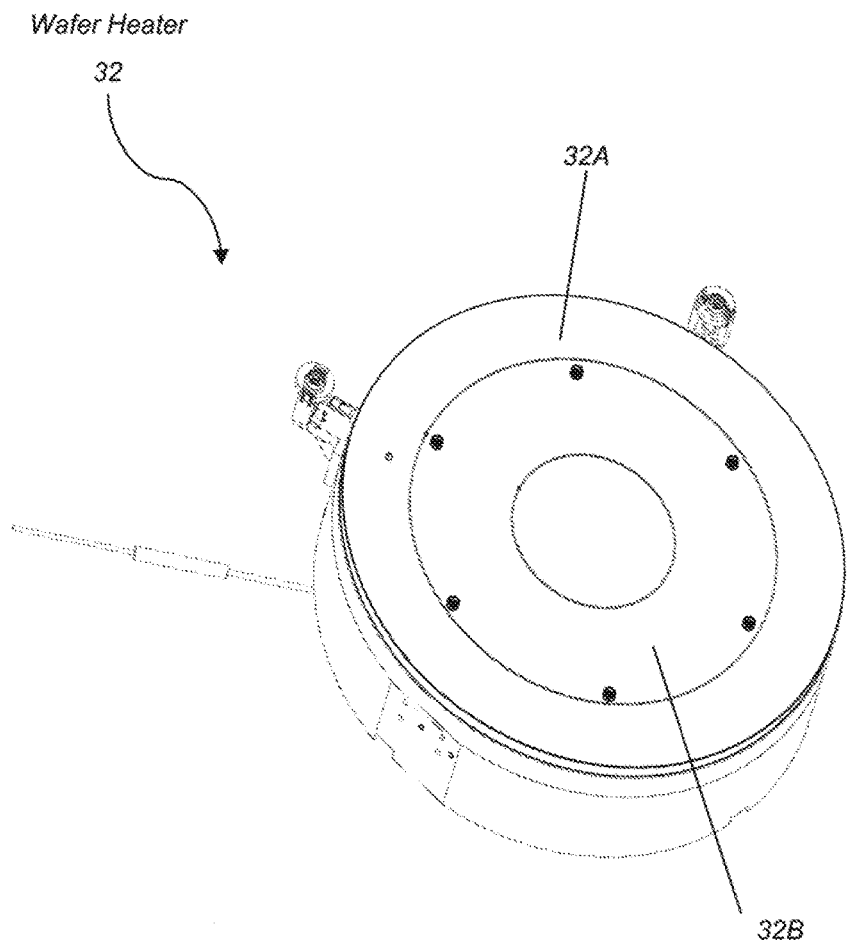
FIG. 18 is a schematic diagram of the wafer heater system.

Referring to FIGS. 6-14, bond apparatus 10 operates generally as a clamp. The apparatus 10 has opposing clamping blocks in this embodiment, an upper block assembly 20 and opposing lower block assembly 22. The lower block 22 assembly has a chuck 21 for holding or otherwise receiving one or more wafers thereon. One or more stacks 430 of one or more wafers 410, 420, shown in FIG. 3, are positioned on the wafer chuck 21 of the apparatus 10. Lower block assembly 22 is supported by the bottom plate 56, and upper block assembly 20 is supported by the top plate 53. Bottom plate 56 and top plate 53 are movably connected to posts 42. In this embodiment, the lower block assembly 22 and the bottom plate 56 move upward along the Z-direction to bring the wafer(s)/stack(s) substantially to or near contact with bearing surfaces 23S of the upper block assembly 20. When this proximity position is reached, the positions of the bottom plate 56, top plate 53, and upper block assembly 20 are fixed, and the lower block assembly 22 is moved upward along the direction of arrow P1 toward the upper block assembly 20 to apply a desired high bonding pressure on the wafer stack 430. In one example, the desired bonding pressure is 100 kN on a 200-mm wafer stack or 225 kN on a 300-mm wafer stack. In alternate embodiments, the upper block 20 or both the upper block 20 and the lower block 22 are moved together to apply the desired high bonding pressure on the wafer stack(s) 430 and effectuate bonding between the interfacing wafer surfaces 410a, 420a. The upper block assembly 20 and lower block assembly 22 deliver the high bonding pressure substantially uniformly (i.e., without significant pressure variance) across the area of the wafer bond interface 405 and without inducing substantially any shearing stress at the interface (e.g., substantially zero shearing stress at the bond interface of the wafers), as will be described in greater detail below. The load distribution within the upper block assembly 20 and lower block assembly 22, resulting in the aforementioned bonding pressure, is a substantially true column loading in respective load bearing members, substantially eliminating load eccentricities and bending moments causing flexure in the upper and lower block assemblies 20, 22, as well as other portions of the apparatus 10. Loading uniformity and repeatability are provided by a structural skeleton 16 of the apparatus 10 that substantially bypasses the chamber housing 12 as load bearing member of the apparatus 10. Loading uniformity on the bond interface 405 is further established by the apparatus 10, with a leveling system 82 that maintains the wafer bearing surfaces 23S, 21S of the upper block 20 and lower block 22 assemblies, respectively, substantially level or parallel with each other, and ensures that bonding forces are applied by the lower block and upper block assemblies 22, 20 substantially normal to the bonding interface 405 of the wafer stack 430. Also, as will be described further below, the upper block 20 and lower block 22 assemblies in the exemplary embodiments include heaters 30, 32, respectively, (or thermal cyclers for the thermal cycling of the wafer contact surfaces 23S, 21S) that are thermally isolated from the apparatus structure by load-bearing, vacuum isolation systems 70, 72, respectively. The load-bearing, vacuum isolation systems 70, 72 provide optimal thermal isolation performance while eliminating undesired thermal leaks and reducing thermal mass (and, hence, inertia) of the thermally cycled portion (with commensurate fast cycle time performance), and nevertheless are capable of supporting desired loads (e.g., bonding pressure loads in the exemplary embodiment). In some embodiments, heaters 30, 32 may have more than one heating zone. Referring to FIG. 18, heater 32 includes a first heating zone 32B configured to heat the center region of the wafer and a second heating zone 32A configured to heat the periphery of the wafer. Heating zone 32A is controlled independently from heating zone 32B in order to achieve thermal uniformity throughout the entire bond interface 405 and to mitigate thermal losses at the edges of the wafer stack.

The apparatus 10 is capable of bonding wafers or substrates 410, 420 of any suitable type and size. For example, the substrates 410, 420 may be 100 mm, 200 mm, or 300 mm diameter semiconductor substrates. In the embodiment shown in FIG. 3, the wafers 410, 420 are substantially similar to each other. In alternate embodiments, the stack 430 may comprise different types or different size wafers. Stack 430 is shown in FIG. 3 as having two wafers 410, 420 for example purposes. As may be realized, stack 430 may include any desired number of wafers being bonded together. The bonded surfaces 410a, 410b may include bond layers 412 and 422, respectively, and the bond layer 412, 422 may be metal, grid structures, semiconductor structures, insulators, adhesives, or glass, among others.

Figure 7:
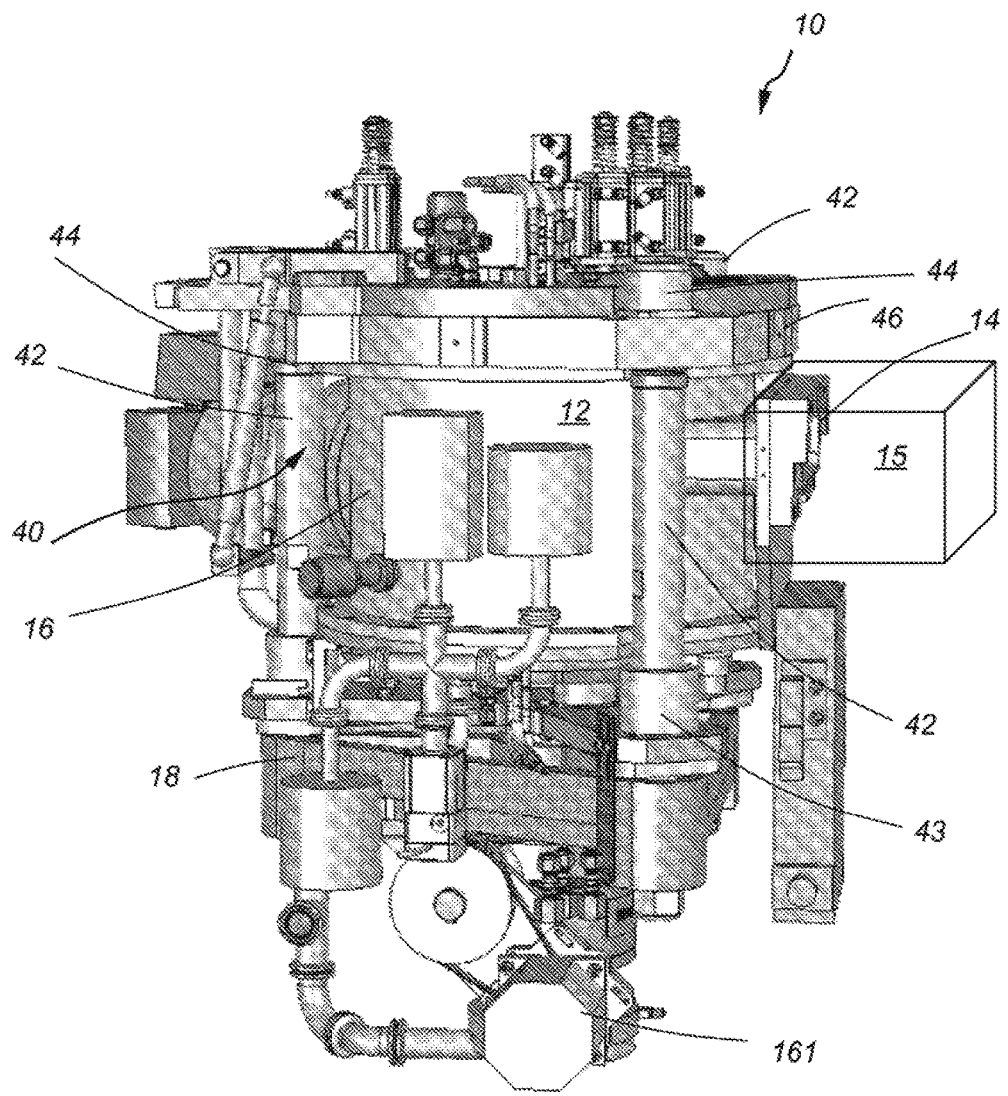
FIG. 7 is a perspective view of a wafer bonding apparatus.
Figure 16:
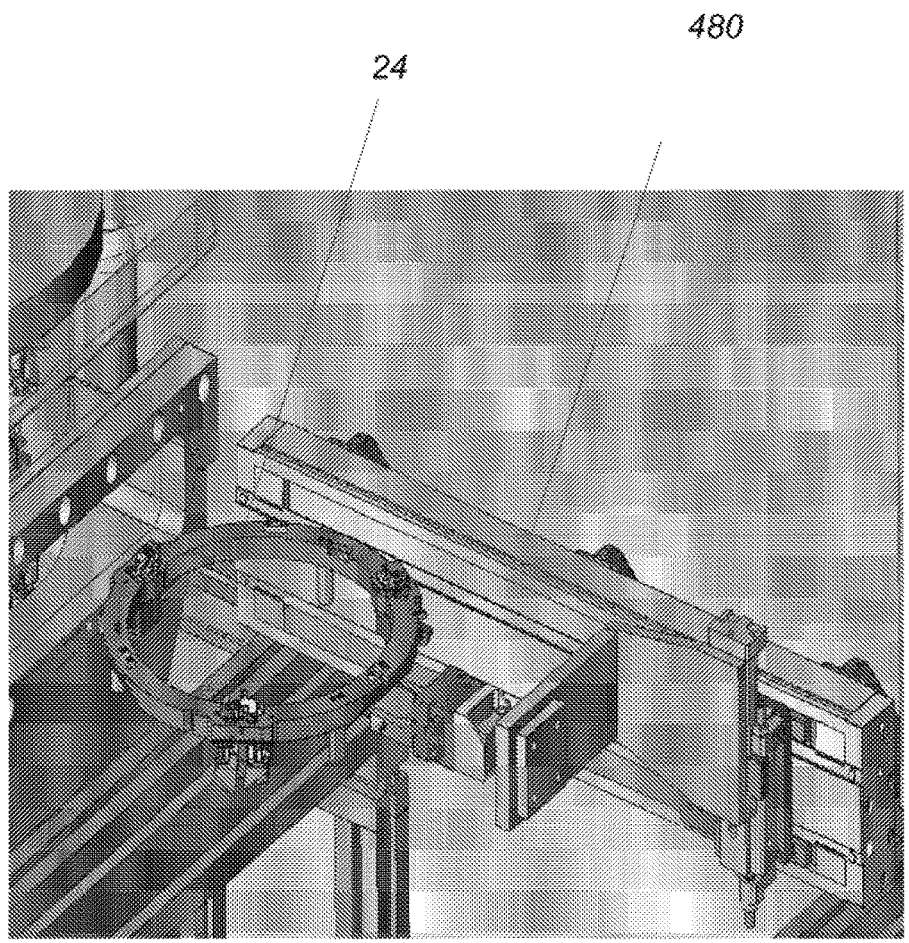
FIG. 16 is a perspective view of the wafer carrier fixture and the wafer loading system.
Figure 17A:
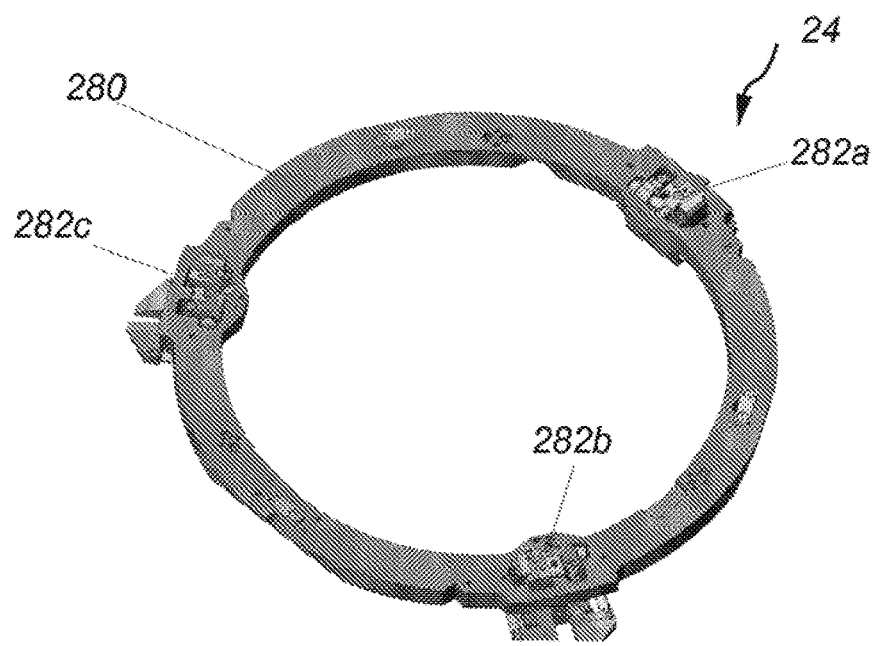
FIG. 17A is a top perspective view of the wafer carrier fixture.
Figure 17B:
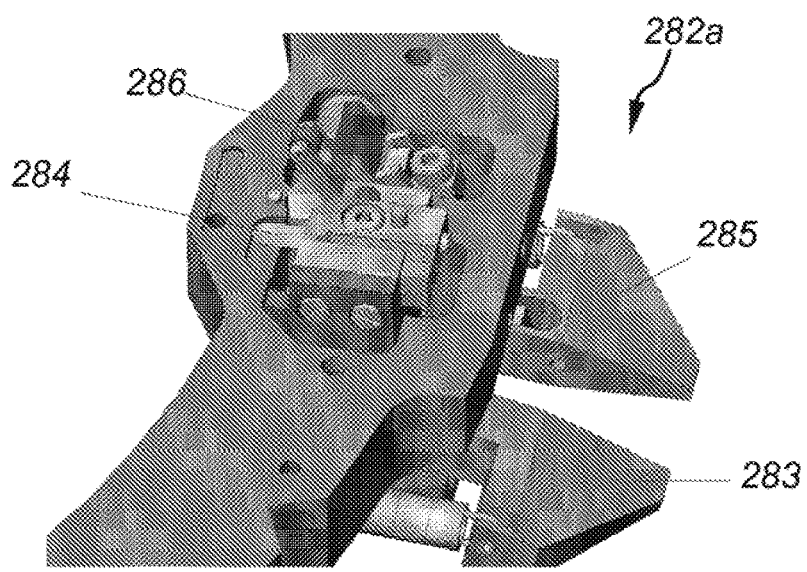
FIG. 17B is a detailed view of the wafer spacers and clamping system in the wafer carrier fixture of FIG. 17A.

Still referring to FIGS. 6-14, and in greater detail, bond apparatus 10 includes a chamber 12. The chamber 12 is closed or otherwise configured to have a controlled atmosphere, such as an inert gas, or is held in vacuum conditions with a turbo pump system 161, shown in FIG. 7. In alternate embodiments, the apparatus may not include a chamber. As seen in FIG. 7, the chamber 12 includes an access port 14. The access port 14 is sized to allow placement and removal of a carrier fixture 24 into the chamber 12, shown in FIG. 9. In some embodiments, a pre-load chamber 15 communicates with chamber 12 through port 14, as shown in FIG. 7. Port 14 has a door (not shown) for closing the port if desired. For loading the wafer stack into the evacuated chamber 12, first, the port door is closed, and the carrier fixture 24 with the pre-aligned wafers 410, 420 is placed in the pre-load chamber 15. Next, the pre-load chamber 15 is evacuated, and then the port door is opened, and the carrier fixture 24 with the pre-aligned wafers 410, 420 is placed in the chamber 12. The port door is then closed again. For the removal of the bonded wafers, the pre-load chamber 15 is evacuated, and then the port door is opened, and the carrier fixture 24 with the bonded wafers 410, 420 is removed from the chamber 12, and the port door is closed again. Carrier fixture 24 holds the previously aligned wafer stack 430. A transport device 480, such as a transport arm or slide, that is automated or otherwise manually operated, is used to move the carrier fixture 24 into and out of the chamber 12, as shown in FIG. 16. In one embodiment, shown in FIG. 17A, carrier fixture 24 is a circular shaped ring 280 and includes three spacer and clamp assemblies 282a, 282b, 282c arranged symmetrically at the periphery of the circular ring at about 120° apart. Each spacer and clamp assembly 282a, 282b, 282c includes a spacer 284 and a clamp 286. Spacer 284 is configured to set the first and second wafers 410, 420, at a predetermined distance. Spacers with different thicknesses may be selected for setting different spacings between the two wafers. Once the spacers are inserted between the wafers, the clamp is clamped down to lock the position of the two wafers. Each spacer 284 and each clamp 286 is independently activated by linear actuators 283 and 285, respectively. For the bonding process, the aligned wafers 410, 420 are placed in the carrier fixture 24 and are spaced apart with spacers 284 and then damped down with clamps 286. The fixture with the clamped wafers is inserted in the bonding chamber 12, and then each damp is undamped one at a time, the spacer is removed, and then clamped again. Once all spacers are removed, the wafers are clamped again, and the two wafers are staked together with a pneumatically controlled center pin 290, and then the force column 460 is applied to facilitate the bonding process. The wafers are staked together with a force that is automatically or manually adjustable.

Figure 8:
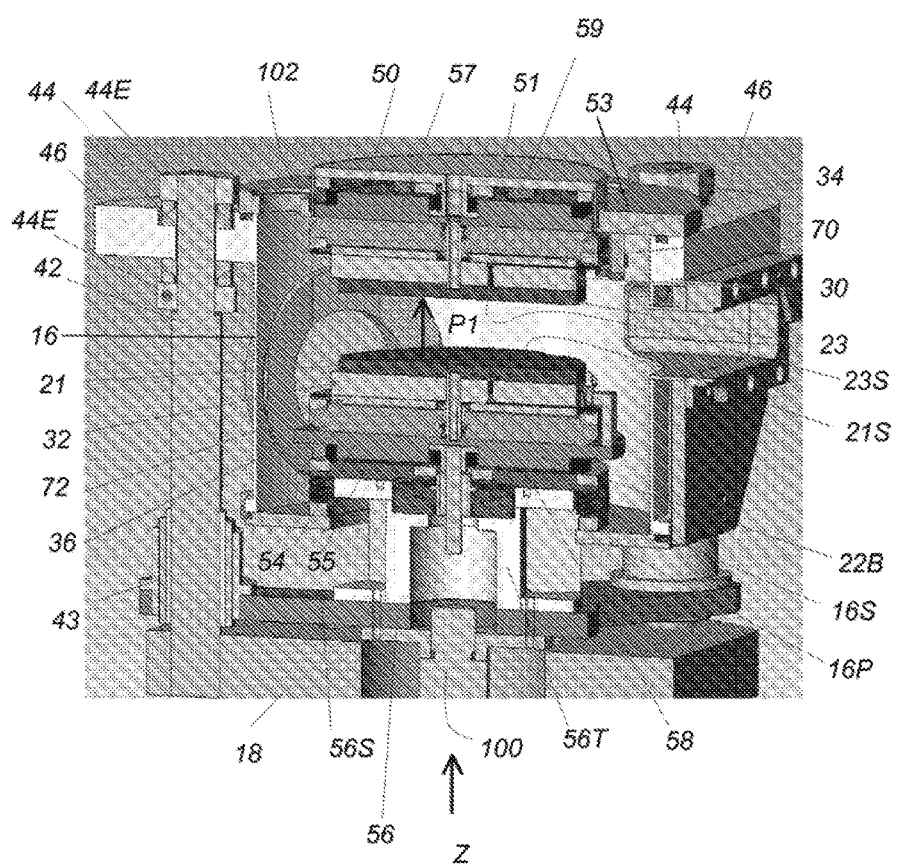
FIG. 8 is a cross-sectional view of the wafer bonding apparatus of FIG. 7.

As shown in FIG. 8, at least one of the upper block 20 and/or the lower block 22 is movably held in the chamber 12. In the embodiment shown in FIG. 8, the upper block 20 and opposing lower block 22 are depicted in a vertical clamping configuration. In alternate embodiments, the opposing upper block 20 and lower block 22 are arranged in any other desired clamping orientation including horizontal clamping configuration. In the exemplary embodiment, the upper block assembly 20 is fixed, and the lower block assembly 22 is movable along the direction indicated by arrow P1, shown in FIG. 6. The lower block assembly 22 is also moved as a unit together with the bottom support plate 56 along the Z-direction (shown in FIG. 6) by a suitable drive 100, referred hereto as a z-drive 100. In the exemplary embodiment, the lower block 22 has a movable portion 22M, capable of being moved in the direction indicated by arrow P1, independent of the z-drive 100, by a suitable actuator 52, as will be described below. In the exemplary embodiments, z-drive 100 provides gross motion to the lower block assembly 22 together with support plate 56, and actuator 52 moves the movable portion 22M of the lower block 22 assembly for bonding. In alternate embodiments, the z-drive 100 moves the upper block assembly 20 downward in the direction opposite to the indicated Z-direction. The upper block 20 and lower block 22 have corresponding seating surfaces 23S, 21S. The upper and lower block assemblies 20, 22 and seating surfaces 23S, 21S are sized as desired to generate suitable bonding pressure on the wafer stack. As noted before and will be described below, the seating surfaces 23S, 21S have heat control (i.e., are capable of being heated and/or cooled). The heat control is provided by any suitable thermal controller. In one example, seating surfaces 21S, 23S are made from a suitably hard material, such as silicon carbide (SiC).

Referring now also to FIG. 7 and FIG. 8, the chamber 12 generally comprises a casing or shell 16 that is substantially closed to allow isolation of the chamber interior from outside. In the exemplary embodiment shown, the casing 16 is generally annular, though in alternate embodiments, the casing may have any desired shape. The chamber casing 16 is supported from a desired base or foundation structure 18 by a skeletal or support frame 40. The base structure 18 is of any desired type and shape and is shown as a substantially flat plate 18 located below the chamber 12, for example purposes. The base structure 18 is substantially rigid and, in alternate embodiments, may have any desired size, shape, and location relative to the chamber. The skeletal frame 40 of the apparatus 10 has substantially rigid members that are attached to the casing 16 and joined to the base structure 18 to carry the casing 16. The skeletal structure 40 is also attached to the upper block and lower block assemblies 20, 22 of the apparatus 10 so that reaction on the upper block and lower block assemblies 20, 22 during the application of the bonding forces is distributed to the skeletal frame 40 and not the chamber casing 16. In the exemplary embodiment, the skeletal frame 40 is substantially an exoskeletal frame located outside the chamber 16. In alternate embodiments, the skeletal frame 40 may be an endoskeletal frame located within the chamber, if desired. In the exemplary embodiment, the skeletal frame 40 comprises substantially rigid post 42 (three are shown for example purposes, though any desired number may be used). Posts 42 are anchored at one end to the base structure 18. The posts 42 are distributed substantially equally around the casing 16. Size and shape of the posts 42 is selected as desired for desired rigidity. The skeletal frame 40 also may include a top attachment plate 46. As seen best in FIG. 7, the attachment plate 46 is attached to the casing 16 by any desired attachment means, such as welding, brazing, or mechanical fasteners. In alternate embodiments, the casing 16 and attachment plate 46 may be formed as a unitary member. The attachment plate 46 is a substantially rigid member. The stiffness of the plate 46, at least in response to reaction loads imparted thereon by the bonding press, is generally commensurate with the stiffness of the rest of the skeletal frame 40, including posts 42. In alternate embodiments, the attachment plate 46, attaching the casing 16 and other bonding press components inside the chamber 12 to the skeletal frame, may have any other desired shape. As seen best in FIG. 8, the posts 42 are attached at another end to the attachment plate 46. The connection 44 between each post 42 and attachment plate 46 may be bi-directional, capable of supporting axial loads, along the axis of posts 42, both towards and away from the base plate 18. The connection 44 of each post is adjustable (both up and down along the axis of the posts) to ensure substantially uniform loading of each post 42 under both static loads from the chamber and apparatus components, and static and dynamic loads during bonding press. In the exemplary embodiment, the connection 44 is generally symmetrical on opposite sides of the interface with the attachment plate 46. The connection 44 may include engagement members 44E (for example, threaded arms) that engage the post 42 (e.g., by positive engagement surface or clamping) and have a bearing surface for bearing loads from the attachment plate. The connection 44 may include bearing elements to ensure uniform load distribution from the attachment plate onto the bearing surfaces of the engagement members 44E. In alternate embodiments, the connection between the posts 42 of the skeletal frame 40 and attachment plate 46 carrying the chamber casing and bonding press may have any suitable configuration. In the exemplary embodiment, the connection 44 may be preloaded (e.g., by torqueing engagement members 44E) in order to eliminate undesired displacements of the posts 42 during bonding operation.

As seen best in FIG. 8 and as noted before, in the exemplary embodiment, the upper block assembly 20 and the lower block assembly 22 are attached to the skeletal frame 40. The upper block assembly 20 is attached to skeletal frame 40 by a span support structure 53, as will be described further below. The static and dynamic loads, including bonding press loads, from the upper block assembly 20 are carried substantially entirely by the span structure 53 and distributed by the span structure 53 via attachment plate 46 to the posts 42. The lower block assembly 22 is attached to the posts 42 via a seat structure 56. In the exemplary embodiment shown, seat structure 56 generally has a span 56S and a block support seat 56T. In alternate embodiments, the seat structure supporting the lower block may have any other desired configuration. In the exemplary embodiment, the span structure 56S is shown as a plate, for example, but may have any other desired form, and is attached to the posts 42 by linear slides 43. Thus, in the exemplary embodiment, the seat structure 56 and, hence, the lower block assembly 22, is capable of movement in the direction indicated by arrow z (z-direction). The posts 42 may serve as guides for z-movement of the lower block. In the exemplary embodiment shown in FIG. 8, the z-drive 100, which may be any suitable drive (e.g., electric linear drive, pneumatic drive, or hydraulic drive, to name a few), is connected to the span structure 56S and capable of moving the seat structure 56 and lower block assembly 22 in the z-direction as a unit. The z-drive 100 may be attached to the base structure 18. As seen in FIG. 8, the support seat 56T is connected to the lower block assembly 22. In the exemplary embodiment, the support seat 56T extends generally into the casing 16. A bellows seal 16S, between the casing 16 (in the example, shown attached to a closure plate 16P of the casing) and the support seat 56T, isolates the chamber interior and accommodates the z-motion of the seat structure 56 and lower block assembly 22. The seat structure 56 shown in FIG. 8 is merely exemplary, and in alternate embodiments, the structure may have any desired configuration. In the exemplary embodiment, the seat structure 56 has a seat surface 58 that engages the bottom of the lower block assembly 22.

Figure 13:
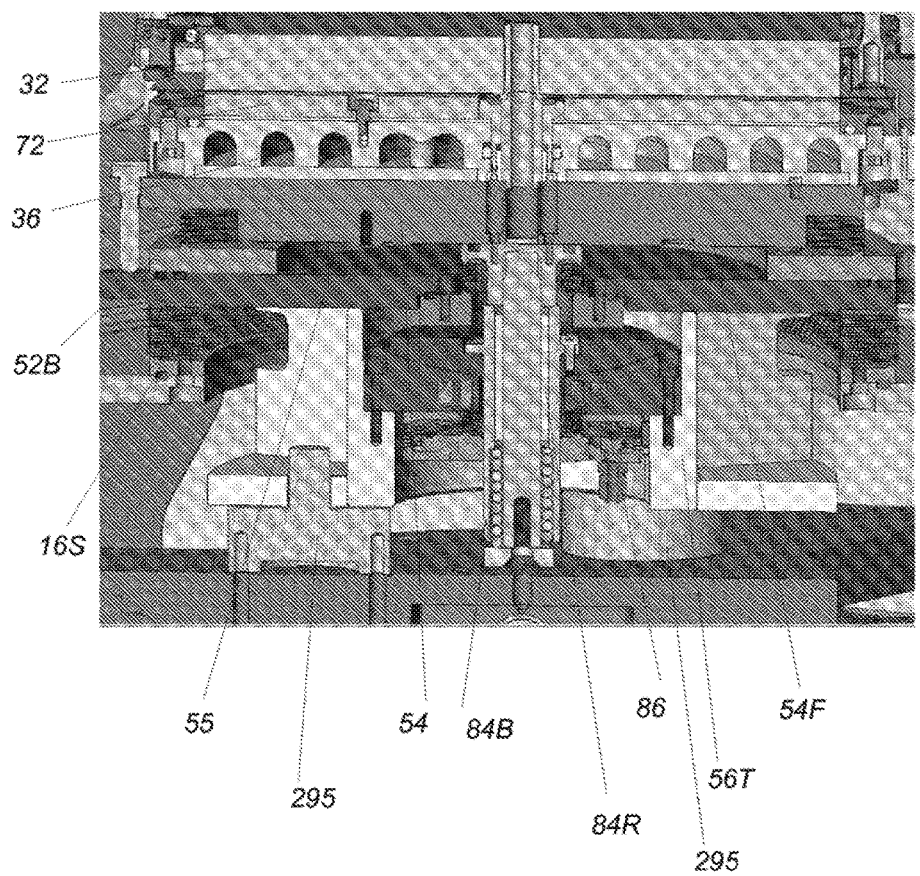
FIG. 13 is a detailed cross-sectional view of one embodiment of the alignment system in the wafer bonding apparatus of FIG. 8.

As seen best in FIG. 8, the lower block assembly generally includes a chuck 21, with wafer support surface 21S, a heater (or thermal cycler) 32, and flange 36. The heater 32 is supported by flange 36. The heater 32 is thermally isolated from the flange 36 by a load-bearing, vacuum isolation system 72, described further below. The flange 36 is maintained at a desired steady-state temperature by a thermal regulator (e.g., a water cooling system). The chuck 21 is connected to the heater 32 so that the wafer support surface 21S and, hence, the wafer seated thereon is heated by the heater 32. The chuck 21, heater 32, and flange 36 form the movable section 22M of the block assembly 22. Movable section 22M is movable in direction P1 relative to a base section 22B of the block assembly 22, shown in FIG. 9. In the exemplary embodiment, the block assembly 22 includes an actuator 52 that actuates the movable portion 22M, independent of the z-drive motion, and generates a force column substantially uniformly distributed across the seating surface 21S of the block assembly 22. In the exemplary embodiment, the actuator 52 is driven by a pressurized gas, though in alternate embodiments, the actuator may be driven by hydraulic or magnetic means capable of generating a substantially uniformly distributed force column across the wafer seating surface. In the exemplary embodiment shown in FIG. 8, the actuator 52 has a movable plate member 54 and a base or reaction member 55. In this embodiment, the base member 55 is fixedly seated against surface 58 of seat structure 56. Bellows seals 52B join the plate 54 and base members 55 of the actuator 52 and isolate the actuator from the chamber interior, as shown in FIG. 13. As may be realized, a desired gas (e.g., clean air or inert gas, such as nitrogen, $N_2$) is introduced between plate 54 and base members 55 for actuation. The pressure of the gas is controlled to achieve the desired high pressures (e.g., about 100 kN on 200-mm wafers; about 225 kN on 300-mm wafers) for bonding the wafer stack. The plate member 54 in the exemplary embodiment has a pressure face surface 54F that is substantially similar (e.g., in shape and size) and aligned parallel to the wafer support surface 21S of the chuck 21 so as to provide a substantially uniform column for loading between plate face 54F and wafer support surface that is substantially normal to the plane of the water support surface. The bonding pressure is monitored with the pressure gauges 295, shown in FIG. 13. In some embodiments, the size of the pressure face surface 54F is adjusted via a manual or an automated mechanism in order to accommodate different size wafers. As may be realized, orthogonality of the loading by the actuator on the wafer support surface may be readily achieved by controlling planarity and degree of parallelism of the plate pressure face and wafer support surface.

Figure 9A:
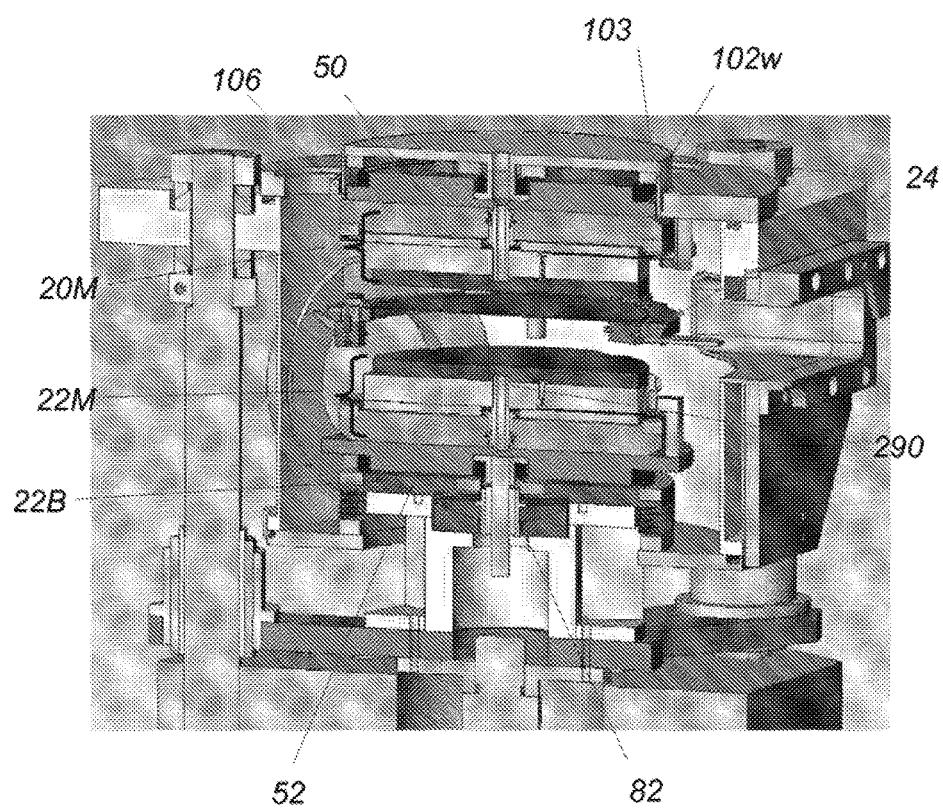
FIG. 9A is a cross-sectional view of the wafer bonding apparatus of FIG. 8 including a wafer transport fixture.
Figure 9B:
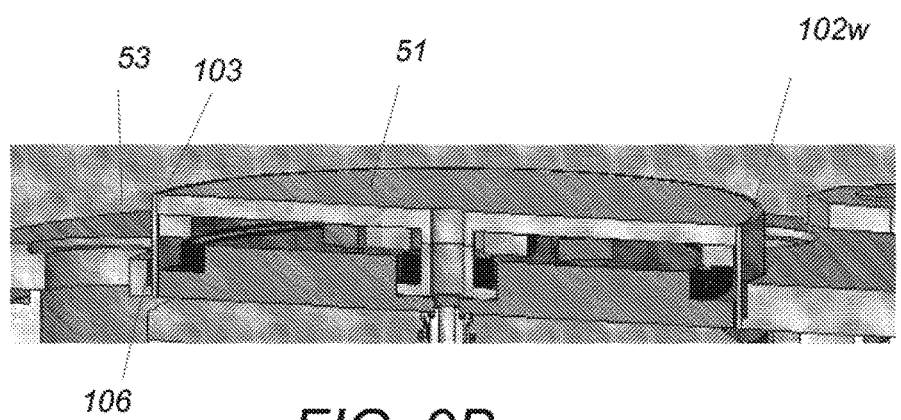
FIG. 9B is a detailed cross-sectional view of a portion of the upper block assembly of FIG. 9A.
Figure 10:
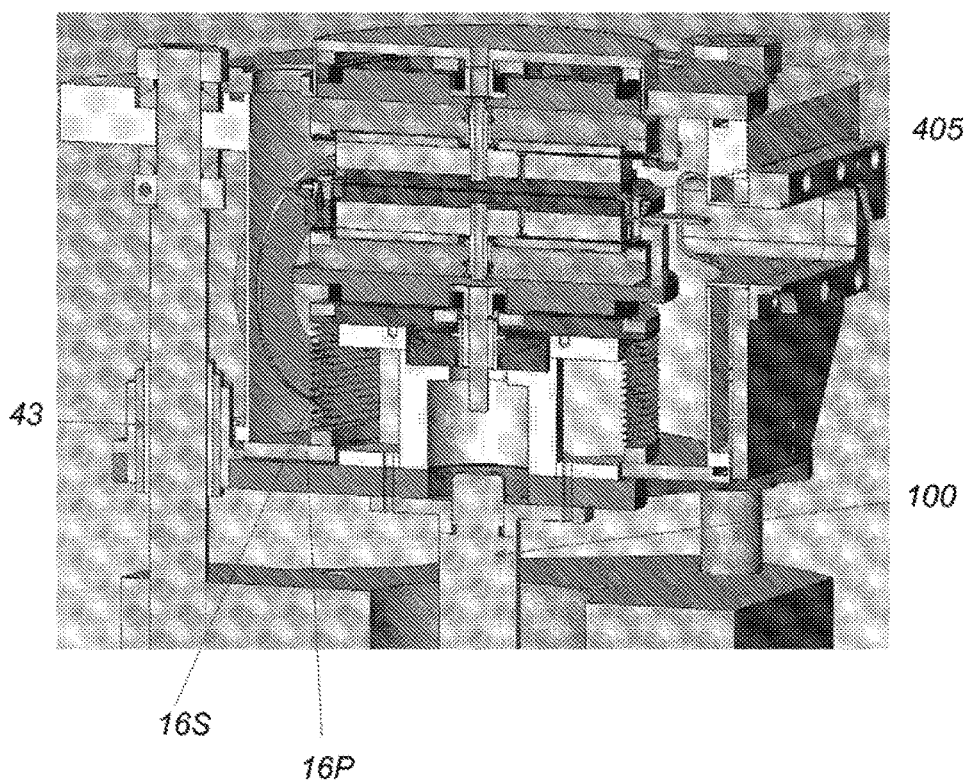
FIG. 10 is a cross-sectional view of the wafer bonding apparatus of FIG. 9 with the wafers being in contact with the top and bottom block assemblies (proximity position)
Figure 11:
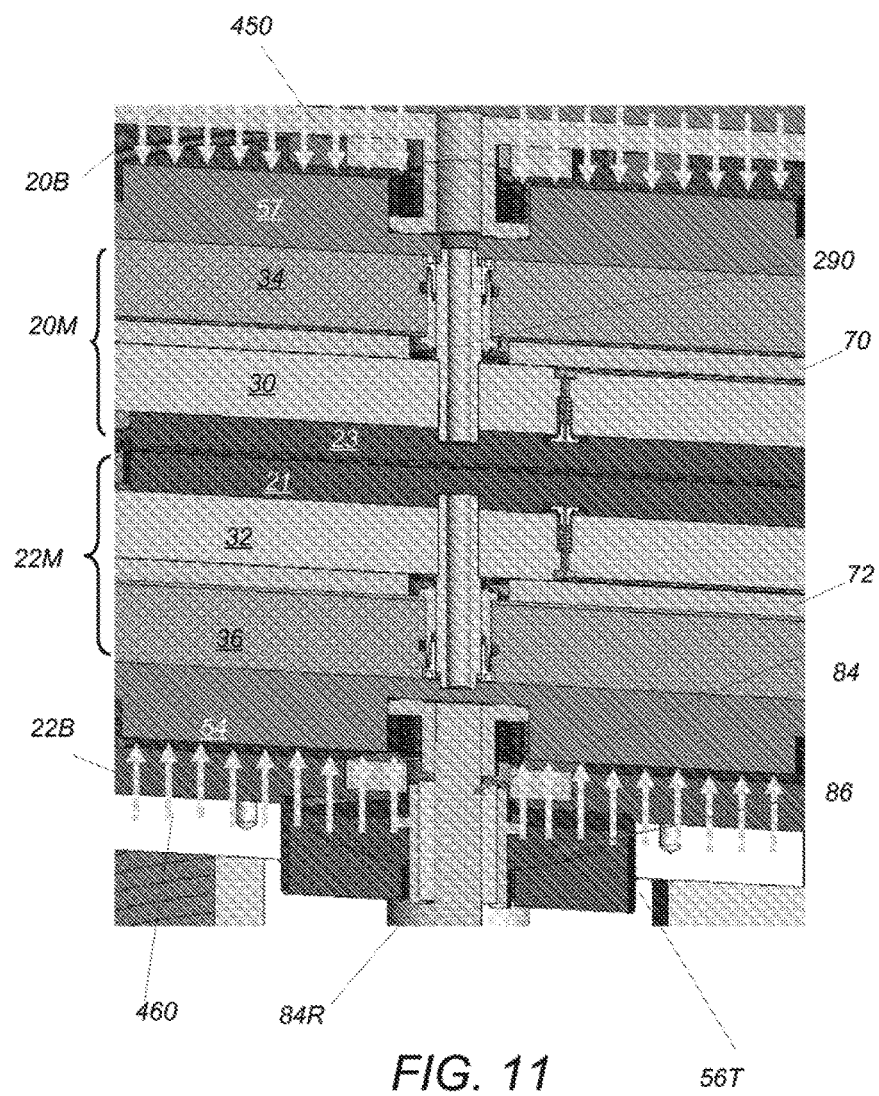
FIG. 11 is a detailed cross-sectional view of the wafer bonding apparatus of FIG. 10.
Figure 12:
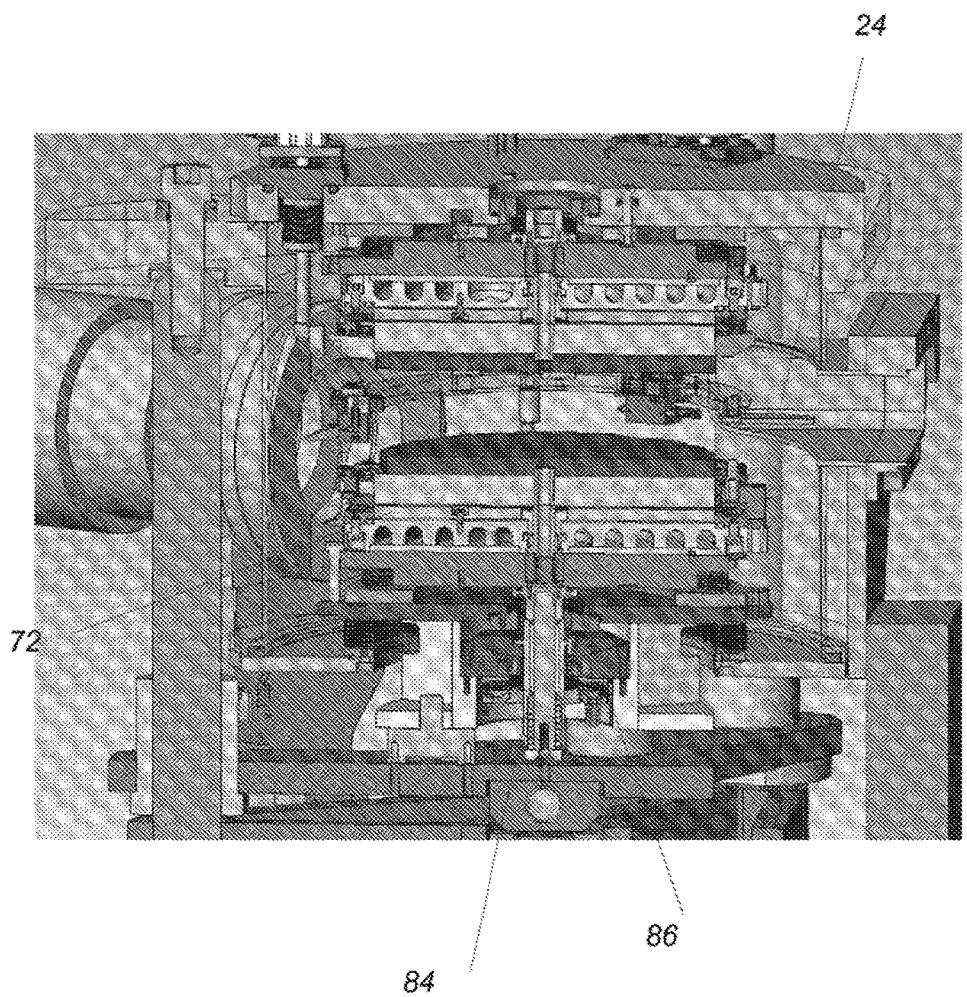
FIG. 12 is a cross-sectional view of the wafer bonding apparatus of FIG. 8 including cross-sectional views of the top and bottom assemblies.

As seen in FIG. 9, the lower block 22 in the exemplary embodiment also includes a leveling system 82 for leveling the wafer support surface 21S of the lower block assembly 22 with the wafer seating surface 23S of the upper block assembly 20. In the exemplary embodiment, the plate member 54 and, hence, the movable section 22M of the lower block assembly 22 rides on a layer of gas with respect to the base 55 and is positionally decoupled from the base 55, except as controlled by the leveling system 82. In the exemplary embodiment, the leveling system 82 includes a linear guide portion 84 and a rotational guide or gimbal portion 86, shown in FIG. 12. The linear guide portion 84 guides the movement of the movable block section 22M so that the wafer support surface 21S travel is substantially axial in the direction indicated by arrow P1 (without any lateral translation). The rotational guide portion 86 guides the movement of the movable portion 22M so that the wafer support surface 21S may rotate and/or tilt around a center point 85 (shown in FIG. 10) corresponding to the center of the wafer bond interface 405 without translation. The leveling system 82 may be autonomous/automatic or may be manually operated if desired. In the exemplary embodiment, the linear guide portion 84 includes a guide rod 84R that is movably supported in a linear bearing assembly 84B, shown in FIG. 13. The guide rod 84R is connected to the plate member 54 as shown in FIG. 13. In alternate embodiments, the linear guide portion 84 may have any other desired configuration. As seen in FIG. 13, in the exemplary embodiment, the linear bearing assembly 84B is mated to gimbal 86, defined by a hemispherical bearing assembly. The hemispherical bearing surface radius extends from the bond interface center 85. The gimbal 86 may be attached to the support seat 56T. In alternate embodiments, the gimbal portion may have any other desired configuration. In still other alternate embodiments, the linear guide and gimbal portions may be mated in any other desired arrangement. As seen in FIG. 13, the leveling system 82 is positioned so that the linear guide portion 84 and gimbal portion 86 are not loaded by the actuator 52 or any other portion of the lower block assembly during bonding operations. In the exemplary embodiment, the gimbal portion 86 is preloaded in order to lock and unlock the bearing surface. Preload may be accomplished by any desired preload system type, such as, for example, pneumatic or hydraulic pressure or mechanical or electromechanical pressure applied against the bearing surface. The preload system may be controllable with a suitable controller (not shown) or may be set to a desired lock limit. The leveling system 82 enables dynamically leveling of the lower block assembly to the upper block assembly. This eliminates the over-constrained condition that occurs when the top and bottom assemblies are not parallel or if the wafer stack is wedge-shaped. The bearing itself does not bear the bond load, and the center of rotation is at the wafer plane so that any rotation that occurs will not impart wafer shift.

Figure 20:
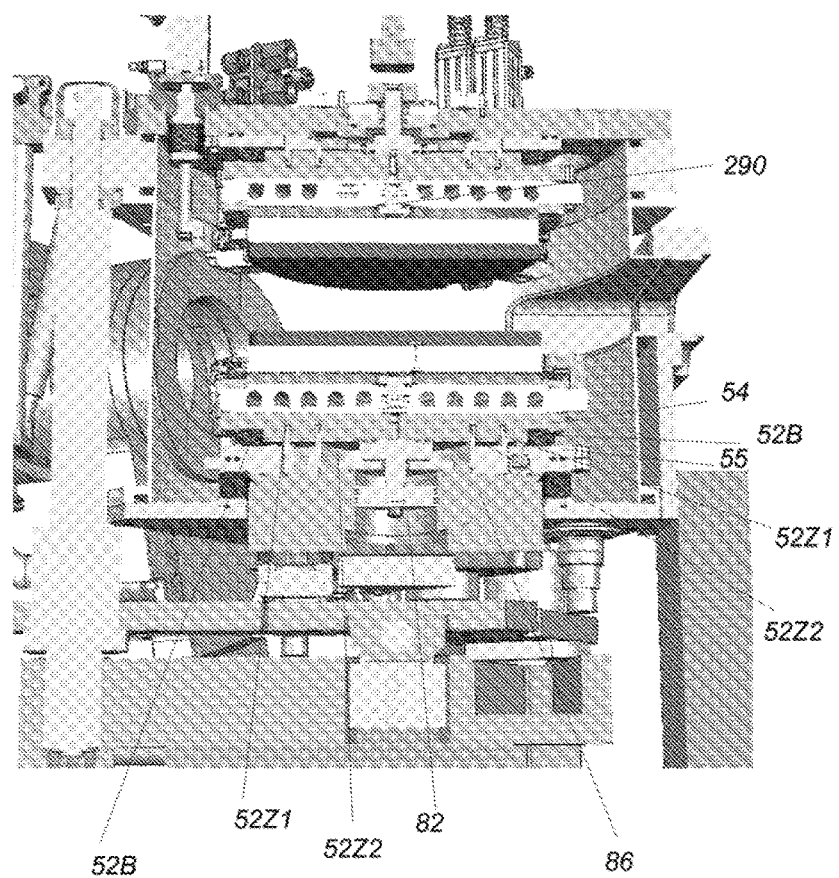
FIG. 20 is a cross-sectional view of another embodiment of the wafer bonding system.

Referring to FIG. 20, in another embodiment, the leveling system 82 is positioned so as to carry the load of the actuator 52 and bears the bond load. The gimbal portion 86 is positioned below the fixed plate 55 and supports the fixed plate 55, the movable plate 54, and the above lying flange 36, thermal isolation system 72, heater 32, chuck 21, and wafers (not shown). In this embodiment, the size of the base of the applied force column is adjusted to accommodate wafers of various sizes. Fixed plate 55 is sealed against the movable plate 54 at the edges with bellows seal 52B and at selectable intermediary locations with piston or zone seals 52Z1 and 52Z2. The sealing locations of bellows seals 52B and intermediary zone seals 52Z1, 52Z2 are selected based on the size of the wafer stack that needs to be bonded and determine the base area of the applied force column. Pressurized gas fills the sealed region between the selected seals. In one example, the location of bellows seals 52B at the edges is selected for bonding 8 inch wafers, zone seal 52Z1 for bonding 6 inch wafers, and zone seal 52Z2 for bonding 4 inch wafers.

Figure 14A:
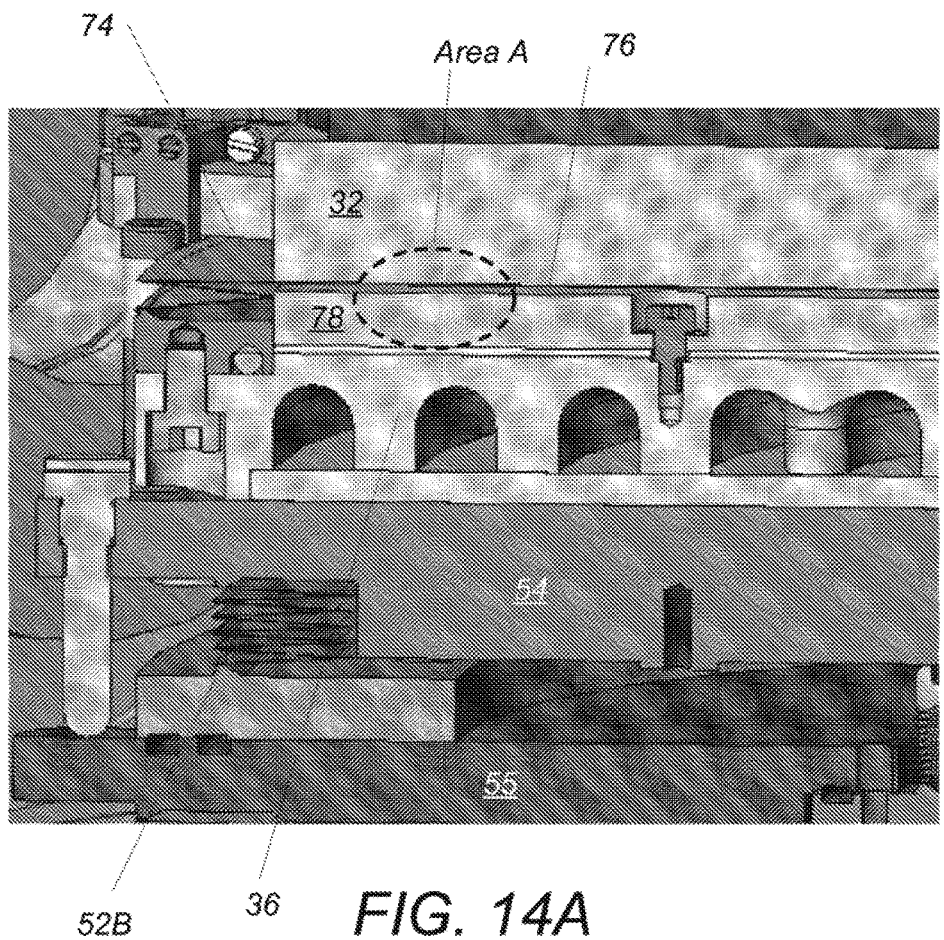
FIG. 14A is a detailed cross-sectional view of the thermal isolation layer in the bonding apparatus of FIG. 8.
Figure 14B:
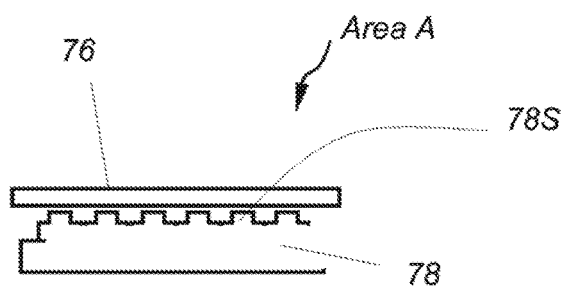
FIG. 14B is a schematic cross-sectional diagram of area A of FIG. 14A.
Figure 15:
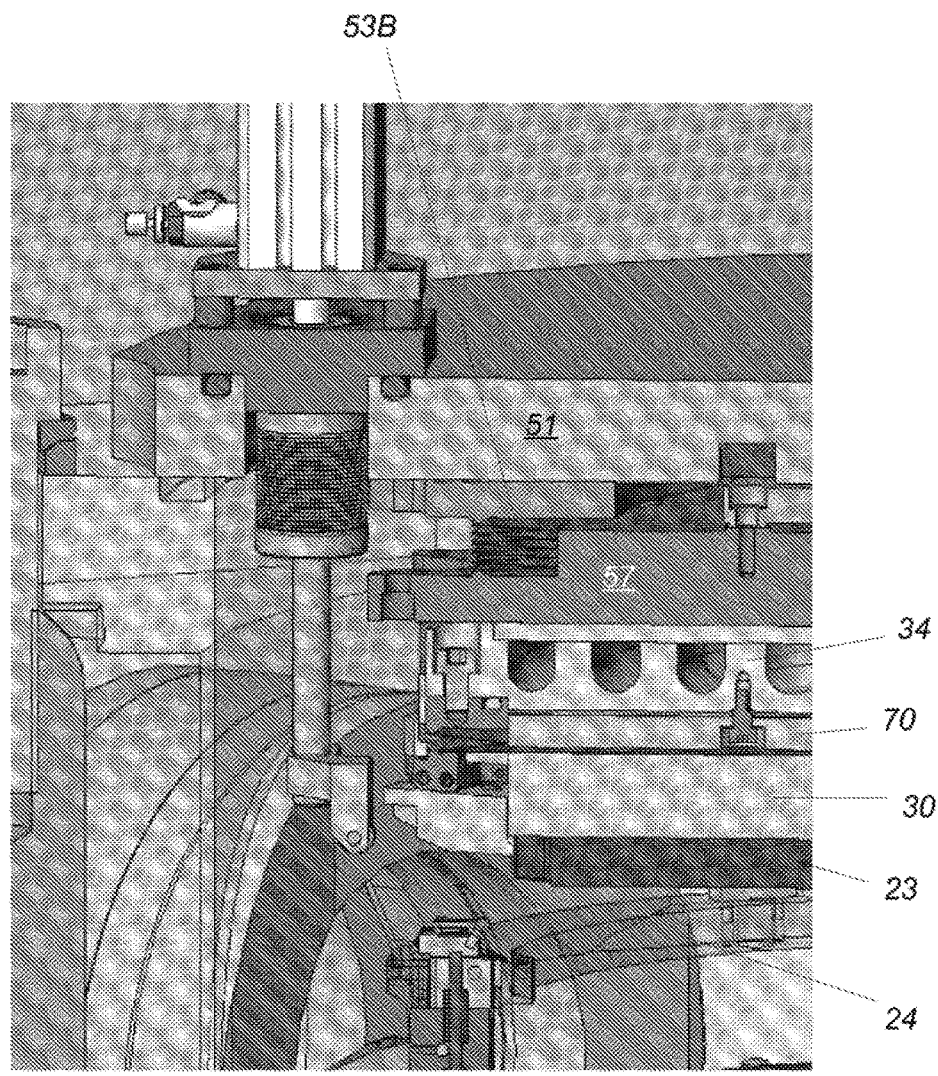
FIG. 15 is a detailed cross-sectional view of a portion of the upper block assembly of FIG. 8.

Referring now also to FIG. 14, as noted before, the lower block assembly has a thermal isolation system 72, thermally isolating the heater 32 from the mating portion of the block assembly supporting the heater. As also noted before, in the exemplary embodiment, the thermal isolation system is a load-bearing vacuum isolation system. As seen in FIG. 13, the isolation system 72 is positioned across the loading path from the actuator 52 to the wafer support surface 21S. Hence, the thermal isolation system 72 supports the bonding pressure loads. As seen in FIG. 14, the system 72 generally comprises a load-bearing vacuum layer confined between a plate 78 and a diaphragm 76. Diaphragm 76 is connected to plate 78 via bellows 74 outside of the load-bearing region. The diaphragm 76 may be made of any suitable material, such as INCONEL™, and may be connected in any suitable manner, such as, for example, by welding, to the open end of the bellows 74. As seen in FIG. 14, the bellows 74 are located outside the load-bearing portion of the block assembly, and the diaphragm 76 is positioned in the load-bearing portion. The diaphragm 76 is supported by plate 78 which comprises material having a low coefficient of thermal expansion (CTE). In one example, plate 78 is made of ZERODUR® glass-ceramic, manufactured by Schott AG. Plate 78 has a surface 78S formed to minimize the contact area with the diaphragm 76 yet has sufficient strength to bear the compressive loads during bonding, shown in FIG. 15. This structure 72 is continually evacuated to minimize heat transfer. As noted above, surface 78S is formed, for example, by machining or any other suitable forming process to minimize the contact area with the diaphragm and, hence, provide limited and poor thermal contact area between the diaphragm 76 and the low-CTE material layer 78. As may be realized, the low-CTE material of layer 78 also may have a poor thermal conduction coefficient. In the exemplary embodiment shown in FIG. 15, the contact surface 78S has raised projections that contact the diaphragm 76. The projections are shown schematically in FIG. 15 and may have any suitable shape. For example, the projections may have a cross-section that tapers in to contact the diaphragm. The number and size of projections may be as desired to achieve desired load capacity and thermal conduction properties across the diaphragm/low-CTE material layer interface. As may be realized, the thermal break provided by the isolation system 72 allows for rapid thermal cycling of the heater 32, chuck 21, and wafer stack 430.

Referring again to FIG. 8, in the exemplary embodiment, the upper block assembly 20 is generally similar to the lower block assembly 22, described before. In the exemplary embodiment, the upper block provides the control level surface for stack bonding, and the leveling system 82 operates to level the wafer support surface 21S of the lower block assembly to the wafer support surface 23S of the upper block assembly, as previously described. In alternate embodiments, the upper block assembly 20 may have an integral leveling system. In this embodiment, upper block assembly 20 is not movable. In other embodiments, similar to block assembly 22, the upper block assembly 20 may have a movable portion 20M, with chuck 23, heater 30, and support flange 34 (similar to heater 32 and flange 36 of the lower block) that is actuated in the direction indicated by arrow P1 by actuator 50. As seen in FIG. 8, in the exemplary embodiment, a bad-bearing vacuum thermal isolation system 70, similar to previously described system 72, defines a thermal break between heater 30 and flange 34, The actuator 50 in the alternate embodiment also may be similar to actuator 52. The actuator 50 may have a plate member 57 and reaction or base member 55 joined to the plate member by bellows seals 53B, as shown in FIG. 16. In the exemplary embodiment, the bellows seals 53B are configured to support the movable portion 20M from the base member 55 under static conditions. Preload blocks 59 may be provided for preloading the bellows 53B during static conditions, in order to provide improved control of plate member displacement during actuator operation (e.g., preload blocks counter spring forces in bellows due to weight of movable portion of upper block assembly). As seen in FIG. 8, in the exemplary embodiment, the base member 51 of the actuator is connected to and supported from span member 53 by connection section 102. Connection section 102 is substantially rigid in axis z, in order to transfer z-loads between the base member 51 and the span member 53 without any substantial elongation. During the bonding process, the connection section 102 behaves as a pinned connection and, hence, is unable to transfer bonding moments. In the exemplary embodiment shown in FIG. 8, the connection section 102 includes an annular shell or wall 102w joined at one end 103 to the base member 55. The wall 102w has a flange 106 that extends between wall 102w and span member 53 and joins the wall 102w to the span member 53. Flange 106 may be formed integral to the wall 102w or to the span member 53. The flange thickness is similar to the thickness of the span member at the interface between flange 106 and span member 53. If integrally formed with the span member 53, the flange 106 is joined in any desired manner (e.g., by welding) to the wall 102w and vice-versa. The flange 106 serves to offset the wall 102w from the span member 53 and, hence, reduces the flexural stiffness of the wall 102w to span member 53 joint and renders the wall 102w substantially unable to transfer bonding loads between actuator base member 51 and span member 53. As may be realized, this allows the base member 51 to remain substantially flat when the actuator is pressurized for bonding the wafer stack in the chamber.

Although the aforementioned embodiments provide substantial improvement over known mechanisms, some aspects of them are expensive or complex to configure and use. Thus, various improvements are described below.

Referring again to FIG. 6, it is desirable that upper block assembly 20 be level with respect to lower block assembly 22 so that even pressure is applied across the entirety of surfaces 23S and 21S when they are brought together. As described previously with respect to FIG. 8, some z-axis adjustment is possible at connection 44 of each post 42 by adjustment of corresponding engagement members 44E. In an embodiment using three such posts 42, such two-dimensional leveling can be obtained. However, in practice, it is found that configuration using this mechanism is time-consuming and somewhat difficult. As an improvement, and referring now to FIG. 21, in one embodiment, in place of each of two of the three posts 42, a threaded post 2101 is engaged with a differentially threaded adjustment collar 2102, which is surrounded by leveling sleeve 2110. To ensure threads of adjustment collar 2102 are properly seated before being placed under load so that adjustment does not change under load, preload springs 2105 (e.g., preload washers) are engaged between attachment plate 46 and post 2101, with upper spacer stop 2103 and hex screw 2104 placed as shown to provide a range limit stop. A clamp 2106 is configured to provide radial clamping force to minimize z-axis movement when it is tightened after leveling adjustment is complete. Leveling sleeve 2110 includes a shoulder 2111 allowing hex shoulder screw 2112 to prevent rotation (or other movement) of leveling sleeve 2110 during adjustment. In one embodiment, springs 2105 are Belleville-style coned disc washers stacked as shown (e.g., within a generally cone-shaped seat feature defined in attachment plate 46) to provide the desired preload capacity and range of adjustment, which, in some embodiments, is approximately ±2 mm with a preload force of at least 5 kN or greater (e.g., about 10 kN or greater, about 15 kN or greater, and so forth). In one embodiment, threaded adjustment collar 2102 is differentially threaded in the manner of a micrometer drive system, with outside threads of 2 mm pitch and inside threads of 1.5 mm pitch, yielding an effective pitch resolution of about 1.0 mm or less (e.g., about 0.75 mm or less, about 0.5 mm or less, and so forth). In some embodiments, the pitch of the inside threads may be about 0.5 mm less than the pitch of the outside threads.

Figure 21:
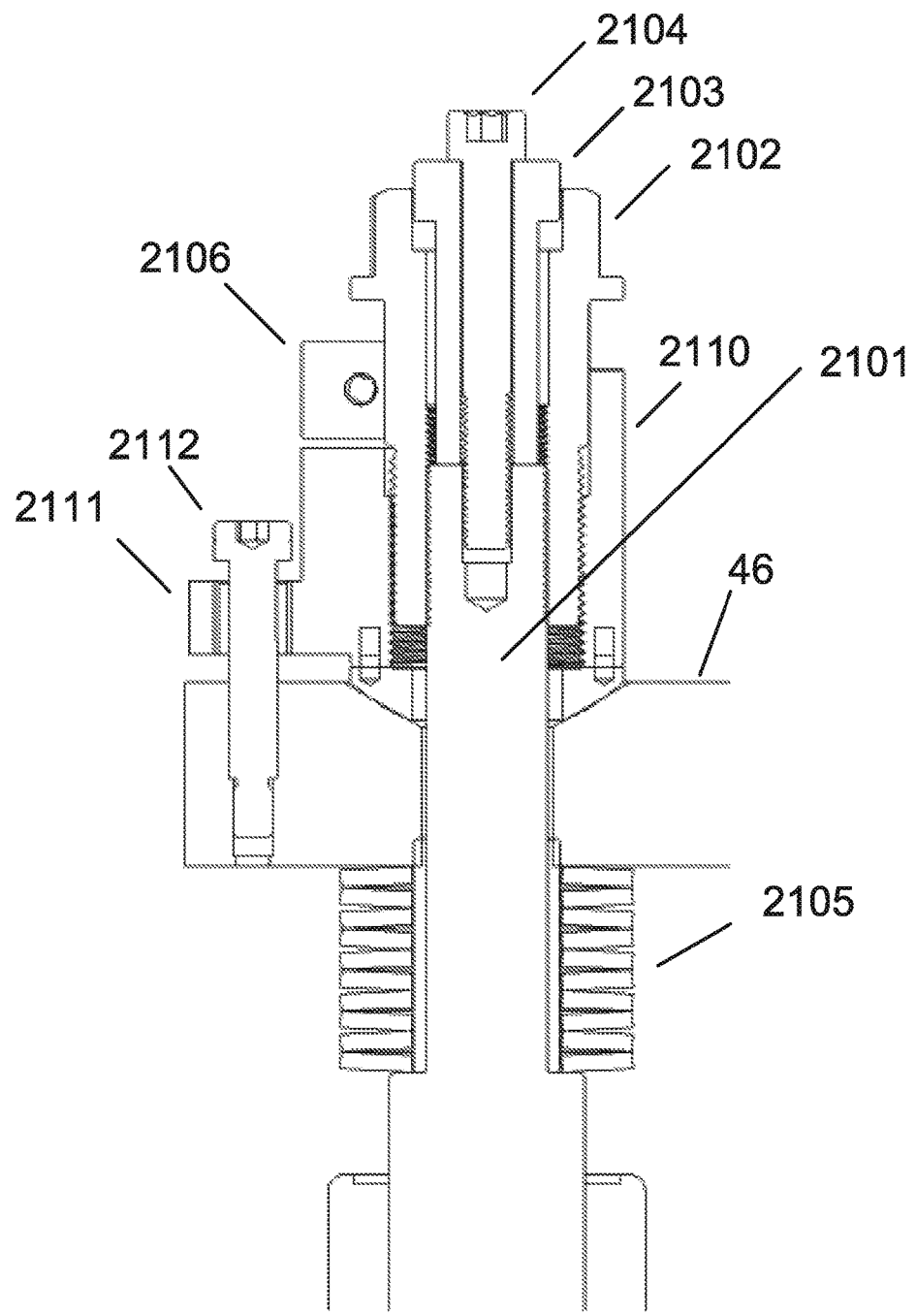
FIG. 21 is a cross-sectional view of a leveling mechanism.
Figure 22:
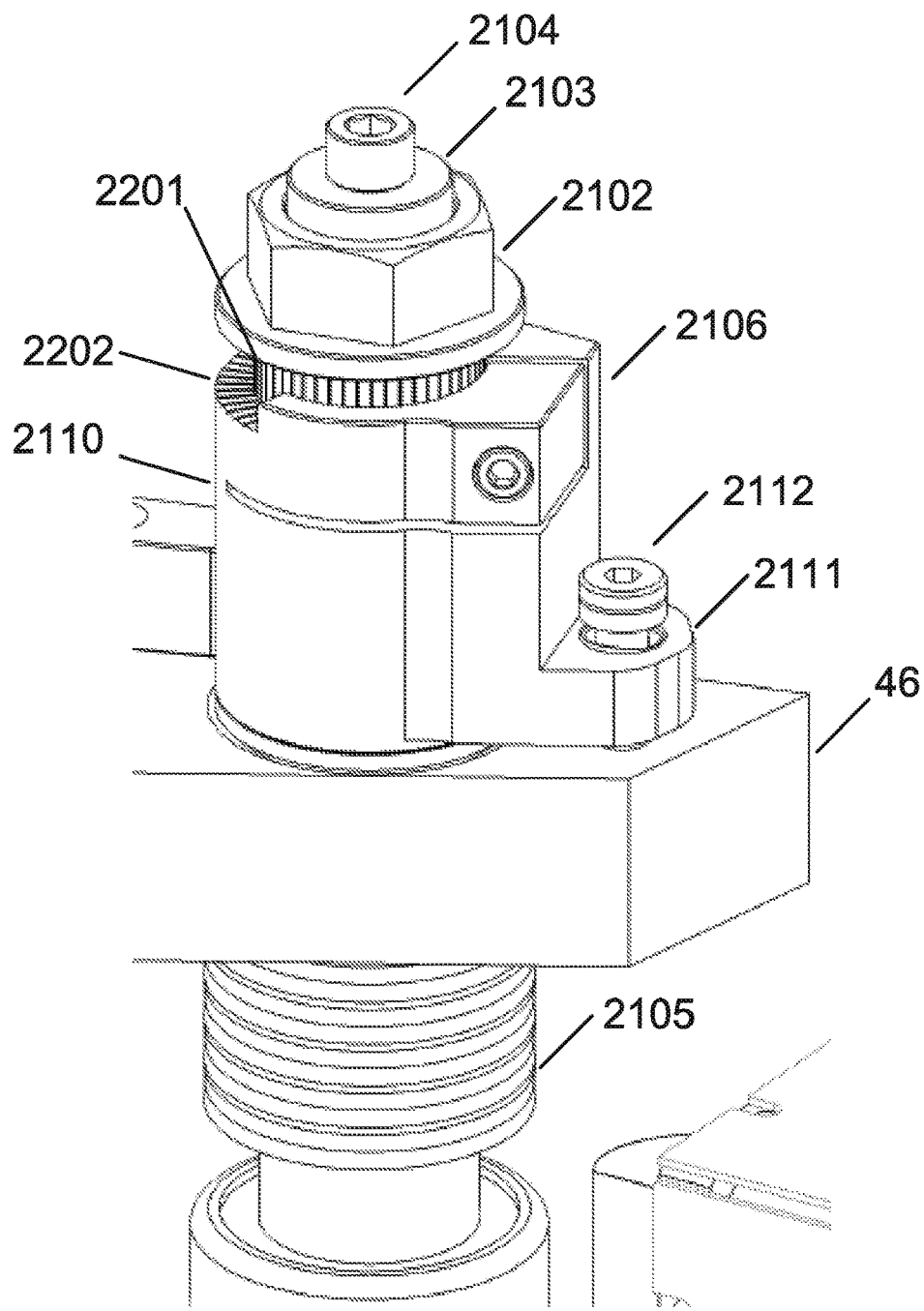
FIG. 22 is a perspective view of the leveling mechanism of FIG. 21.

FIG. 22 is a perspective view illustrating the components discussed in FIG. 21. In the illustrated embodiment, leveling sleeve 2110 includes an integral clamp 2106 formed by cutting away a portion of leveling sleeve 2111. In addition, vernier scale markings 2202 are etched into a portion of leveling sleeve 2110, and vernier scale markings 2201 are also etched onto a portion of threaded adjustment collar 2102, thus permitting user adjustment in a simpler manner than would be possible without such markings. In one embodiment, the vernier scale markings 2201 and 2202 provide on the order of one micron (1 μm) of measurement resolution.

Figure 23:
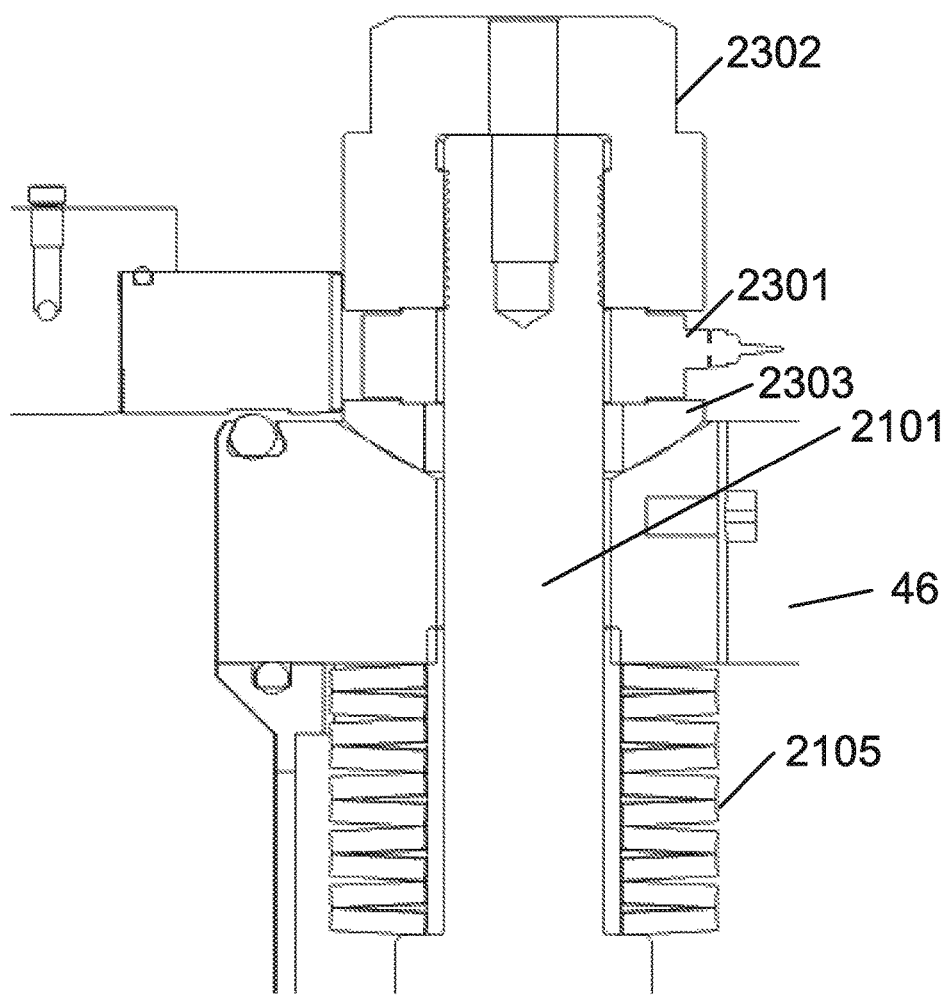
FIG. 23 is cross-sectional view of a gimbal mount for use with the leveling mechanism.

As previously noted, in one embodiment, two of three posts 42 are replaced with the configurations of components shown in FIGS. 21 and 22. In this embodiment, the replacement for the third post 42 is a non-adjustable gimbal attachment. Having two of three posts adjustable provides the leveling capability sought, and there is no need for a third adjustment point. Referring now to FIG. 23, a third threaded post 2101, rather than being fitted with the adjustment components shown in FIGS. 21 and 22, includes a load cell 2301 with corresponding cap 2302 and gimbal bushing 2303. In one embodiment, cap 2302 is tightened using a cap screw (not shown) and springs 2105 in the same manner as discussed in connection with FIG. 21. Load cell 2301, in one embodiment a model FD0180-N510-1379-M09 (available from ATP Messtechnik GmbH of Ettenheim, Germany) is used for load cell 2301. An advantage of this gimbaled configuration is that load cell 2301 not only forms part of the gimbal, but is also usable as a sensor for the applied force column as previously discussed. Because of equal spacing and symmetrical arrangement of posts 42 (specifically, the posts 2101 discussed with respect to FIGS. 21 and 23), the overall force applied is simply three times the force indicated by load cell 2301. In accordance with some embodiments, a load cell 2301 may be utilized with any one or combination of the posts provided. Thus, multiple load cells 2301 may be employed in one or more locations.

Figure 24:
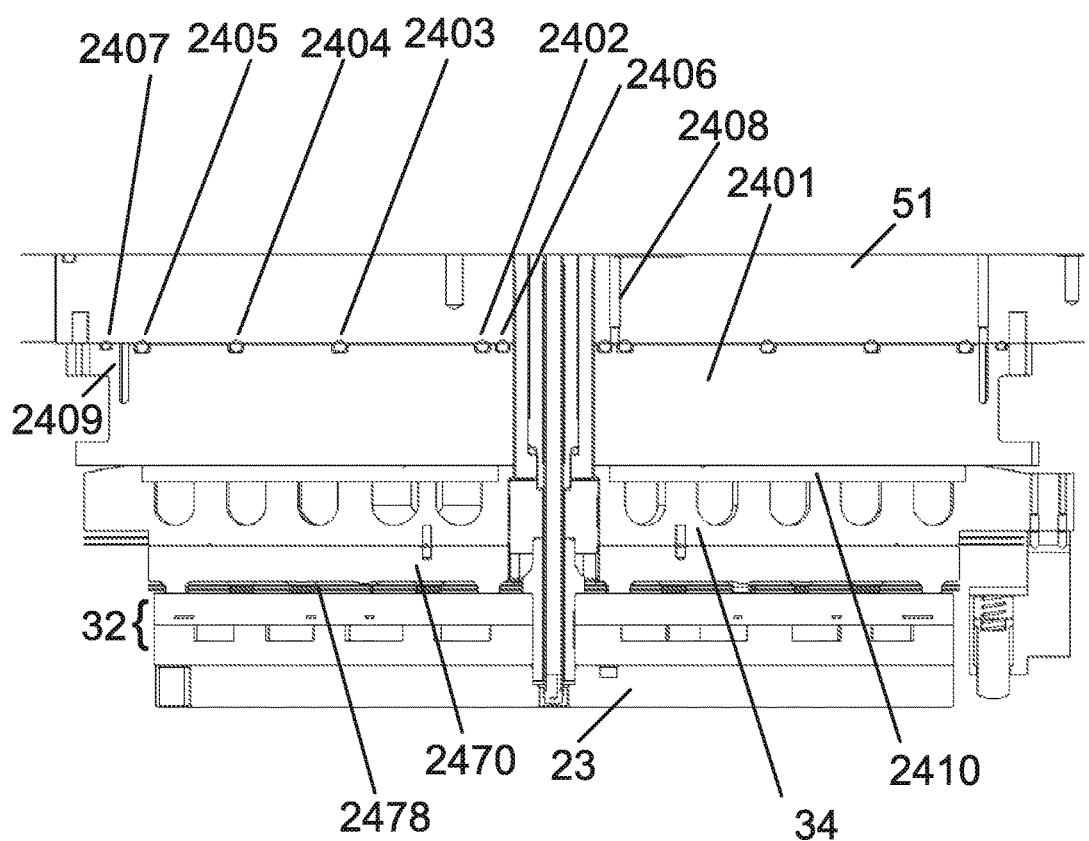
FIG. 24 is a cross-sectional view of a reaction plate and associated components.

As described above in connection with FIGS. 6, 8, and 11, for example, a lower block assembly 22 is configured to be brought into contact with an upper block assembly 20, and in the specific embodiment of FIGS. 8 and 11, associated heater and thermal isolation components 30, 32, 34, 36 are all brought together via force columns 450, 460. In practice, it is found that thermal differences and significant pressures can cause doming of certain components (e.g., upper and lower block assemblies 20, 22 and those components that may be sufficiently pressed against those assemblies to assume their shapes). Although such deformation may be exceedingly small (e.g., in a range of 25-450 μm, in some cases), this can still lead to uneven wafer bonding. Referring now to FIG. 24, in order to minimize such deformation, in one embodiment, a reaction plate 2401 is employed to minimize such unwanted deformations. In one embodiment, reaction plate 2401 is a monolithic machined piece of AISI 1045 steel with no complex moving parts. Reaction plate 2401 is fastened by screws to base member 51, previously described. A set of seals 2402-2407 (with corresponding cross-sections on the right side of FIG. 24 not numbered), in one embodiment O-rings, are placed in corresponding grooves in base member 51 and reaction plate 2401. Seals 2406 and 2407 maintain pressure conditions in the process chamber, which is the region outside the space defined by seal 2407 and inside the space defined by seal 2406. The process chamber environment is a deep vacuum in some embodiments, but may also involve higher pressures (e.g., up to 2 atmospheres in one embodiment). Seals 2402 and 2405 define inner and outer boundaries, respectfully, for introduction of pressurized gas (in the manner previously described) between base member 51 and reaction plate 2401, via corresponding ports (not shown). The spaces between seals 2402 and 2406, as well as between seals 2405 and 2407, are maintained at nominal atmospheric pressure via vents 2408. A portion of the material forming reaction plate 2401 is cut away to form a flexure 2409. Seals 2402-2407 act as dynamic seals, expanding or compressing with the relative movement of corresponding portions of base member 51 with respect to reaction plate 2401, thereby obviating the need for more complex structures, such as pistons, that would otherwise maintain a seal with such movement. In one embodiment, seals 2402-2405 are implemented using 3 mm diameter O-rings, which are found to maintain good sealing even at pressures on the order of 37 bar (e.g., approximately 537 psi).

Seals 2403-2405 are configured to permit pressurization appropriate for the three different standard sizes of wafers. For 4-inch diameter wafers, pressurized gas is applied via appropriate ports to the region between seals 2402 and 2403; for 6-inch diameter wafers, the zone between seals 2403 and 2404 is also pressurized. For 8-inch diameter wafers, the zone between seals 2404 and 2405 is pressurized as well. Note that seal 2407 is smaller than the other seals because it is outside the flexure 2409 in an area not subject to significant deformation.

In practice, it is found that any unwanted variation in bonding force and corresponding substrate chuck deformation due to doming of components such as base member 51 in the embodiments described (e.g., in FIG. 15) is dramatically reduced by use of reaction plate 2401 pressurized in the manner described.

Figure 25:
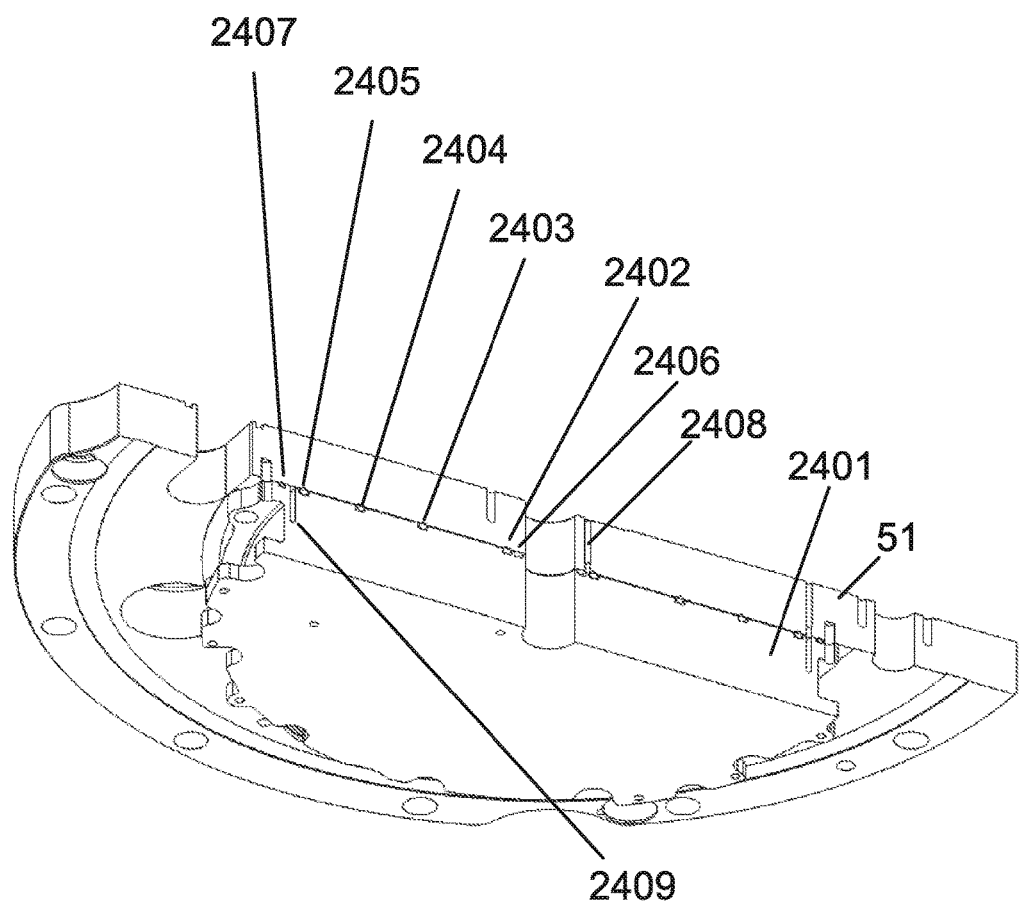
FIG. 25 is a cutaway perspective view of the reaction plate of FIG. 24.

Also, illustrated in FIG. 24 are various elements between reaction plate 2401 and chuck 23 (previously described), in one embodiment. As shown, these include a water-cooled flange assembly including cap 2410 and support flange 34, as previously described, and heating and thermal isolation components including isolation plate 2470 and previously described heater 32 with heat shields 2478, as further detailed below. FIG. 25 is a cutaway perspective drawing of reaction plate 2401 as well as many of the associated components illustrated in FIG. 24.

Figure 26:
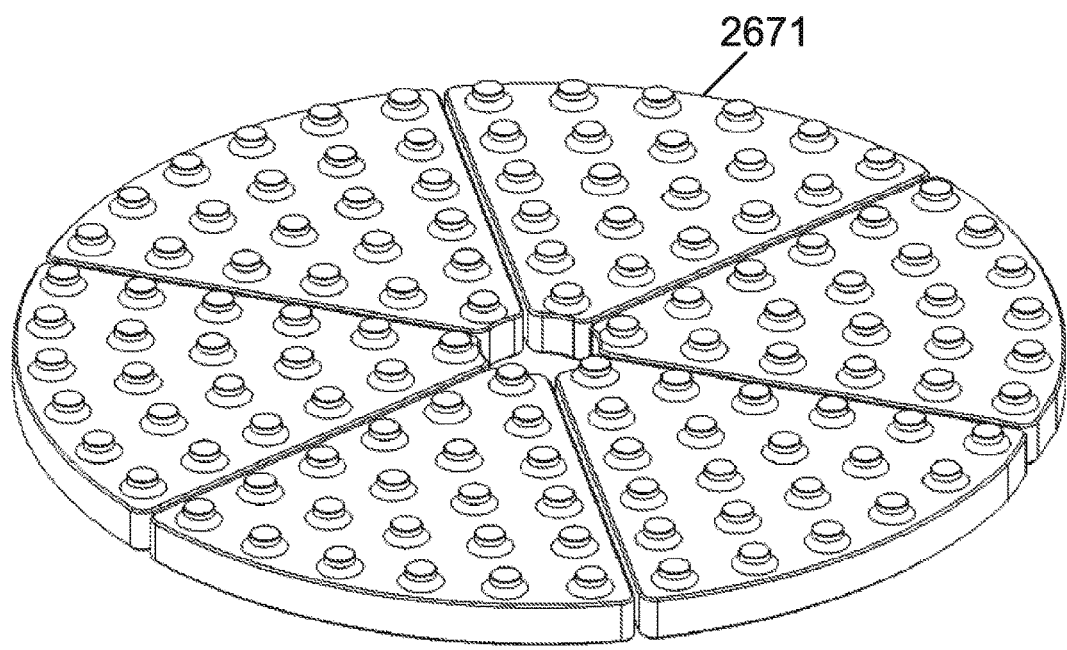
FIG. 26 is a perspective view of a thermal isolation plate made up of wedge-shaped sections.

Isolation plate 2470 is found to exhibit improved durability and service life, as well as being less complex, as compared with the thermal isolation systems previously described in connection with, for example, FIGS. 14 and 19, even under the temperature and pressure extremes of repeated use. In one embodiment, isolation plate 2470 is formed of low-CTE material as previously described, with a set of stacked heat shields 2478 placed between the isolation plate 2470 and heater 32 to provide enhanced thermal isolation. Referring now to FIG. 26, rather than using the single low-CTE plate 78 and diaphragm 76 system of FIG. 19, in one embodiment, the isolation plate 2470 is formed of a number of pie-shaped wedges 2671 of low-CTE material. It is found that a benefit of using such wedges 2671 rather than a single piece of low-CTE material is the minimization of detrimental effects from thermal expansion/contraction. Such expansion/contraction of a single such piece, when it is in contact with another piece having a different coefficient of thermal expansion (e.g., diaphragm 76, shown in FIG. 19) may result in abrasion of either the low-CTE material, the other piece, or both. Since the pie wedges 2671 are independent, each can move slightly with respect to another, and thus abrasion from movement due to thermal expansion/contraction is minimized or otherwise reduced. In some instances, wedges 2671 may be configured to be arranged in a generally circular manner, with vertices pointing towards a common center, though other arrangements may be provided in accordance with other embodiments. Furthermore, the use of wedges 2671 permits isolation plate 2470 to provide a small amount of desirable compliance deflection in the range of about 50 μm or less (e.g., about 30 μm or less, about 10 μm or less, about 5 μm or less, and so forth) and tolerate such deflection without cracking, as low-CTE materials typically are not particularly forgiving in these aspects.

Figure 19:
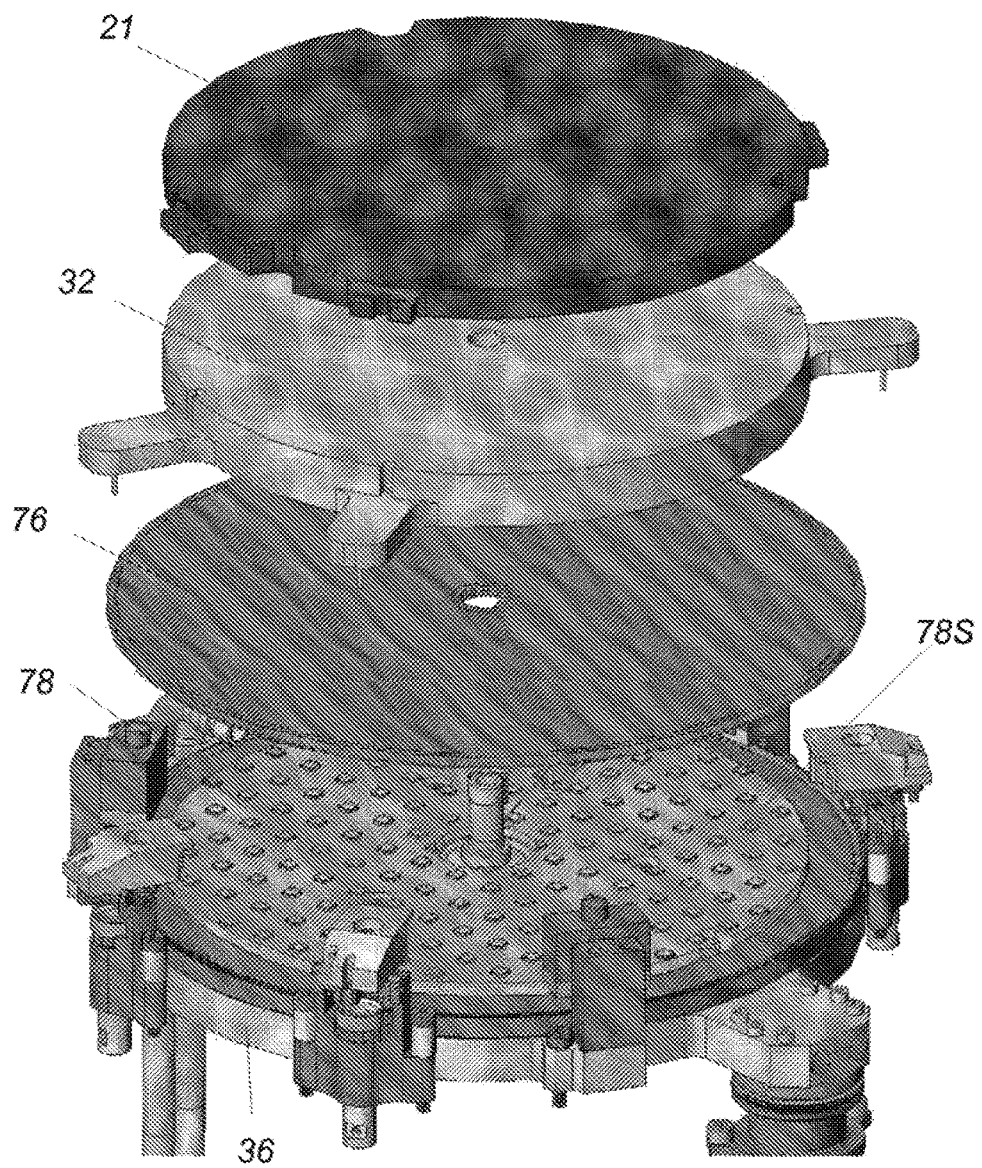
FIG. 19 is an exploded view of the wafer heater and thermal isolation systems.

In one embodiment, further improvement over diaphragm/vacuum systems such as those of FIG. 19 is achieved by use of stacked foil heat shields 2478 rather than relying on a vacuum (and, accordingly, relying on diaphragm 76 remaining sound). In one embodiment, the heat shields include two metal foil layers, each of which has cutout holes to match the pattern of raised projections of isolation plate 2470. In one embodiment, head shields 2478 are constructed of stainless steel; in an alternate embodiment, a low-CTE alloy such as Invar is used. In practice, it is found that performance similar to the vacuum-based system of FIG. 19 is achieved, without need for establishing a vacuum at all, with use of isolation plate 2470 and foil heat shields 2478.

Figure 27:
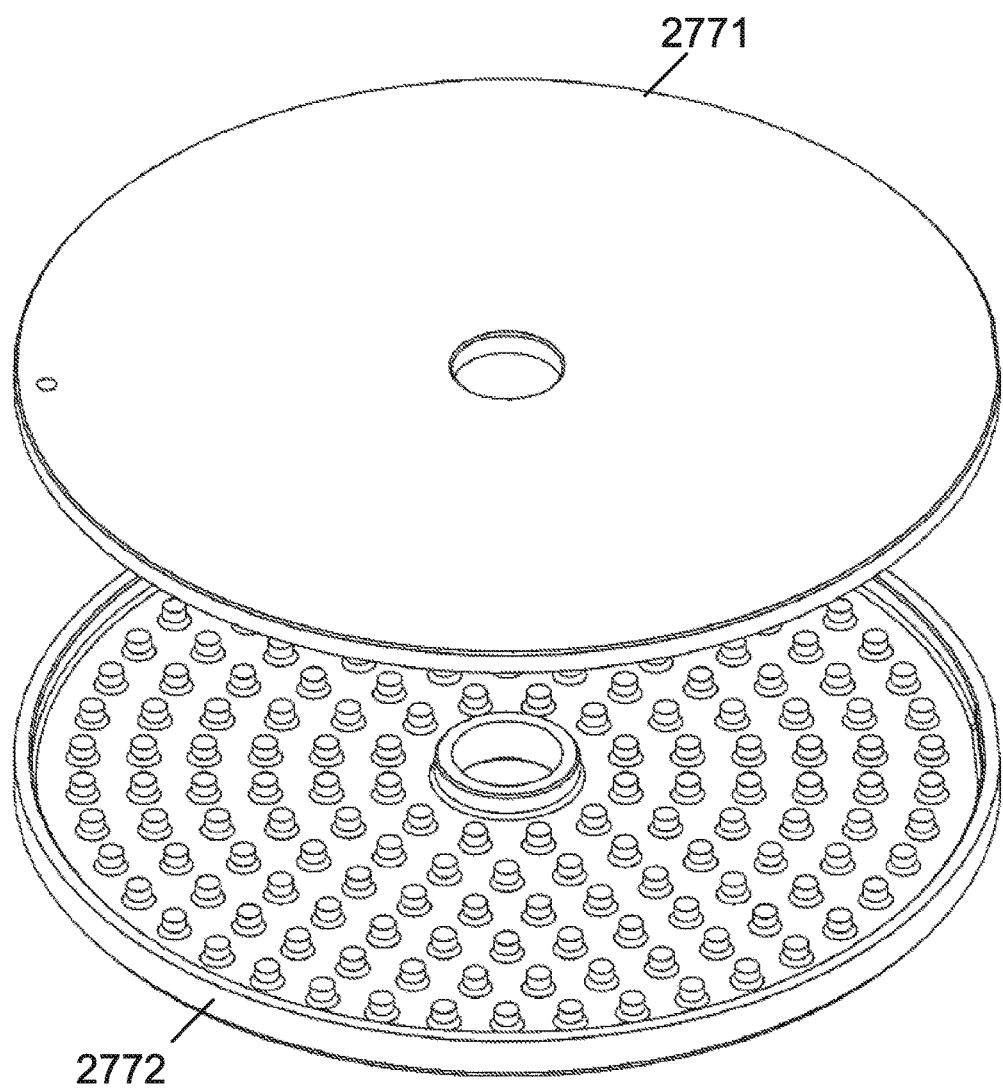
FIG. 27 is a perspective view of a two-portion thermal isolation plate.

Referring now to FIG. 27, in still another embodiment, isolation plate 2470 is formed of two pieces low-CTE material, upper portion 2771 and lower portion 2772. In one variation on this embodiment, heat shields 2478 are not even required, particularly if a slight vacuum is maintained in the voids between upper portion 2771 and lower portion 2772. In this manner, the thermal isolation benefits of a partial vacuum are obtained without the need for a diaphragm that may suffer from wear over time. Combinations of these features also may prove to provide improved performance and wear characteristics, in certain applications. For instance, each of the wedges 2671 of FIG. 26 can be constructed of upper and lower portions 2771, 2772 as shown in FIG. 27.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. A semiconductor structure bonding apparatus comprising:
    a lower block assembly comprising a first surface configured to receive at least one semiconductor wafer thereon;
    an upper block assembly comprising:
        a chuck configured to provide a second surface configured to be brought into contact with the first surface in application of bonding pressure to the at least one semiconductor wafer; and
        a reaction plate disposed over the chuck and configured to reduce deformation of the upper block assembly, the reaction plate comprising:
            a monolithic plate member; and
            a plurality of concentric grooves defined in the monolithic plate member and configured to receive a corresponding plurality of seals; and
    a plurality of ports configured to deliver pressurized gas to a plurality of regions of the reaction plate.

2. The apparatus of claim 1, wherein:
    the plurality of concentric grooves of the reaction plate comprises:
        a first groove; and
        a second groove concentrically exterior to the first groove; and
    the plurality of ports is configured to deliver pressurized gas to the plurality of regions of the reaction plate such that in bonding 4-inch diameter semiconductor wafers, pressurized gas is applied to a first region defined between the first groove and the second groove.

3. The apparatus of claim 2, wherein:
    the plurality of concentric grooves of the reaction plate further comprises a third groove concentrically exterior to the second groove; and
    the plurality of ports is further configured to deliver pressurized gas to the plurality of regions of the reaction plate such that in bonding 6-inch diameter semiconductor wafers, pressurized gas is applied to the first region and a second region defined between the second groove and the third groove.

4. The apparatus of claim 3, wherein:
    the plurality of concentric grooves of the reaction plate further comprises a fourth groove concentrically exterior to the third groove; and
    the plurality of ports is further configured to deliver pressurized gas to the plurality of regions of the reaction plate such that in bonding 8-inch diameter semiconductor wafers, pressurized gas is applied to the first region, the second region, and a third region defined between the third groove and the fourth groove.

5. The apparatus of claim 1, wherein the reaction plate has defined therein a cutaway portion configured to allow flexure of the reaction plate thereat.

6. The apparatus of claim 5, wherein at least one of the plurality of seals is concentrically exterior to the cutaway portion.

7. The apparatus of claim 1, wherein the upper block assembly further comprises a thermal isolation plate disposed between the reaction plate and the chuck.

8. The apparatus of claim 7, wherein the thermal isolation plate comprises a plurality of wedge-shaped pieces that are physically separate from one another and configured to move with respect to one another.

9. The apparatus of claim 8, wherein the plurality of wedge-shaped pieces is configured to be arranged in a circular manner with vertices pointing towards a common center.

10. The apparatus of claim 8, wherein at least one of the wedge-shaped pieces includes a plurality of raised projections extending from a surface thereof, the raised projections spaced apart from one another around the surface.

11. The apparatus of claim 8, wherein at least one of the wedge-shaped pieces constitutes a monolithic element.

12. The apparatus of claim 8, wherein at least one of the wedge-shaped pieces constitutes a polylithic element comprising:
    a lower plate portion; and
    an upper plate portion configured to be disposed over and operatively coupled with the lower plate portion such that vacuum can be maintained in a void defined between the lower plate portion and the upper plate portion.

13. The apparatus of claim 12, wherein the lower plate portion includes a plurality of raised projections disposed on an interior surface thereof and extending toward the upper plate portion within the void defined between the lower plate portion and the upper plate portion, the raised projections spaced apart from one another around the interior surface of the lower plate portion.

14. The apparatus of claim 7, wherein the thermal isolation plate comprises:
    a lower plate portion; and
    an upper plate portion configured to be disposed over and operatively coupled with the lower plate portion such that vacuum can be maintained in a void defined between the lower plate portion and the upper plate portion.

15. The apparatus of claim 14, wherein the lower plate portion includes a plurality of raised projections disposed on an interior surface thereof and extending toward the upper plate portion within the void defined between the lower plate portion and the upper plate portion, the raised projections spaced apart from one another around the interior surface of the lower plate portion.

16. The apparatus of claim 14, wherein at least one of the lower plate portion and the upper plate portion constitutes a monolithic element.

17. The apparatus of claim 7, wherein the thermal isolation plate is configured to provide compliance deflection of about 50 µm or less.

18. The apparatus of claim 1, wherein at least one of the plurality of concentric grooves is configured to receive at least one of the corresponding plurality of seals having a 3-mm diameter.

19. The apparatus of claim 1, wherein the plurality of concentric grooves is configured to receive the corresponding plurality of seals such that sealing is maintained at pressures up to about 37 bar.

20. The apparatus of claim 1, further comprising a water-cooled flange disposed between the chuck and the reaction plate.

* * * * *